(12) United States Patent
Xin

(10) Patent No.: US 7,024,596 B2
(45) Date of Patent: Apr. 4, 2006

(54) EFFICIENT ADDRESS GENERATION FOR INTERLEAVER AND DE-INTERLEAVER

(75) Inventor: Weizhuang (Wayne) Xin, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 653 days.

(21) Appl. No.: 10/012,834

(22) Filed: Nov. 12, 2001

(65) Prior Publication Data

US 2003/0097621 A1   May 22, 2003

(51) Int. Cl.
G01R 31/28   (2006.01)

(52) U.S. Cl. ...................... 714/702; 714/786
(58) Field of Classification Search ........ 714/701–702, 714/761–762, 788, 755, 746, 786; 375/340; 711/157, 217
See application file for complete search history.

(56) References Cited

U.S. PATENT DOCUMENTS

| | | | | |
|---|---|---|---|---|
| 3,652,998 A | * | 3/1972 | Forney, Jr. ................... | 377/64 |
| 5,745,497 A | * | 4/1998 | Ben-Efraim et al. ......... | 714/702 |
| 5,886,998 A | * | 3/1999 | Voith et al. .................. | 714/702 |
| 6,014,761 A | * | 1/2000 | Lachish et al. .............. | 714/702 |
| 6,138,262 A | * | 10/2000 | Baek .......................... | 714/768 |
| 6,151,690 A | * | 11/2000 | Peeters ....................... | 714/701 |
| 6,178,530 B1 | * | 1/2001 | Aman et al. ................ | 714/702 |
| 6,748,033 B1 | * | 6/2004 | Shiraishi et al. ............ | 375/340 |
| 6,785,862 B1 | * | 8/2004 | Zhang ........................ | 714/788 |

OTHER PUBLICATIONS

Garello et al., Interleaver Properties and their applications to the trellis complexity analysis of turbo codes, May 2001, IEEE Trans. on Comm., vol. 49, No. 5, p. 793-807.*
Hanna, S.A., Convolutional interleaving for digital radio communications, 1993, IEEE, p. 443-447.*
Ramsey, John L., Realization of optimum interleavers, May 1970, IEEE, Trans. on. Info. Theory, vol. IT-16, No. 3, p. 338-345.*

* cited by examiner

*Primary Examiner*—Shelly Chase
(74) *Attorney, Agent, or Firm*—Garlick Harrison & Markison LLP; Shayne X. Short

(57) ABSTRACT

Efficient address generation for interleaver and de-interleaver. The present invention performs interleaving and de-interleaving, at opposite ends of a communication channel, by employing an efficient address generation scheme that is adaptable across a wide variety of applications and platforms. The present invention is particularly applicable to communication channels that exhibit a degree of bursty type noise. By employing interleaving and de-interleaving at the opposite ends of the communication channel, the present invention is able to offer a degree of protection against data corruption that may be caused within the communication channel. The present invention allows convolutional interleaving and de-interleaving operation on a code word by code word basis. The present invention provides for very efficient address generation for RAM based convolutional interleaving and de-interleaving. The present invention also provides for reading, writing, and updating offset registers in a code word by code word base manner.

73 Claims, 13 Drawing Sheets

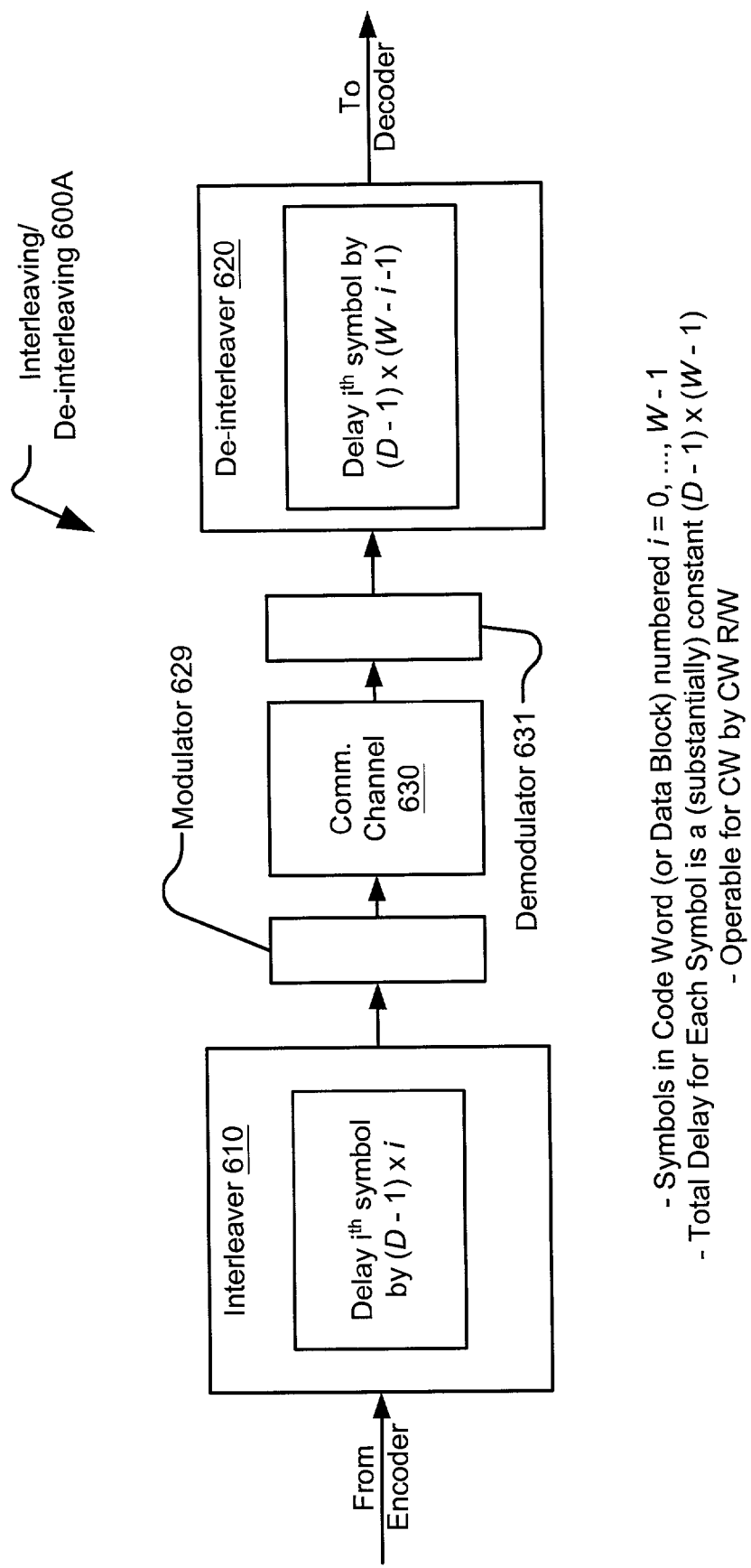

EFFICIENT ADDRESS GENERATION FOR INTERLEAVER AND DE-INTERLEAVER

BACKGROUND

1. Technical Field

The invention relates generally to error correction and digital communication systems; and, more particularly, it relates to employing interleaving (and/or de-interleaving) in combination with applications of error correction codes.

2. Related Art

Previous interleavers are typically employed to try to combat the noise problems associated with communication of information (data) across a communication channel. One particularly problematic noise problem is that attributed to burst noise error. This burst noise error is typically not purely Gaussian, which often makes dealing with it significantly difficult when compared to Gaussian types of noise. Impulse actions within the communication channel, which may arise from a whole host of events, are very problematic, in that, they may wipe out entire blocks of data. In some situations, this may not be problematic. Depending on the channel capacity and data transmission rates involved, some burst error can actually corrupt data that is longer than a code word length. For example, an impulse action, when corrupting a relatively long portion of data, may cause burst error over a portion of data that is much longer than that which a code word may correct. This is especially problematic as data transmission rates across communication links continue to increase; where a particular event (that is relatively lone with respect to the channel capacity and data rates involved) may wipe out even more blocks of data. In addition, impulse noise problems are typically not purely Gaussian in nature; this characteristic makes dealing with them oftentimes much more difficult, in dealing with these impulse noise problems, than in dealing with other noise types that have typical Gaussian distributions.

In the communication context, one effort to combat this problem is to try to employ some error correction codes, so that the actual signal may be retrieved even in the event that some error is introduced during the data's transmission over the communication channel. Then, in the receiver side, the error correction is performed. Numerous types of error correction exist, as understood by those persons having skill in the art, including block error correction codes and convolutional error correction codes and other types. In addition, if the duration of an impulse noise source is too long, then any of these previous error detection and correction schemes simply cannot perform the correction. The data will simply be lost.

One method that has been developed to try to combat these problems has been to interleave the data at the transmitter side of the communication channel before transmitting it over the communication channel to the receiver side. Interleaving may be viewed as trying to permutate the data at one end of the communication channel, so as to try to achieve the situation where block of data that is corrupted by the communication channel may be interleaved throughout many code words of the data; it may be viewed an effort to reduce the probability that entire blocks of data may be lost during the communication through the communication channel. Then, at the other side of the communication channel, any corrupted data will, hopefully, be able to be corrected to ensure that whole sections or blocks of the data are not lost. Ideally, using interleaving and error correction techniques in combination, the bit error rate of the communication channel will ideally be reduced.

However, while many prior art interleaving methods do effectively reduce bit error rates, their implementation typically requires many registers and memory to achieve their proper operation. Here, there is a situation where interleaving has been introduced to try to assist the error correction techniques, in trying to preserve the data to an even greater extent, yet the inefficiencies and the processing-consumptiveness of various previous interleaving schemes often prohibit their very implementation.

Further limitations and disadvantages of previous, conventional, and traditional systems will become apparent to one of skill in the art through comparison of such systems with the invention as set forth in the remainder of the present application with reference to the drawings.

SUMMARY OF THE INVENTION

Various aspects of the invention can be found in a communication system that is operable to perform interleaving and de-interleaving. If desired, an embodiment of the present invention includes a single system that is tailored to perform interleaving only or de-interleaving only, thereby being operable to interface with other systems that are operable to perform only one and/or both of the interleaving and de-interleaving on the other end of a communication channel. In certain embodiments, the present invention employs both an interleaver and a de-interleaver, separated by a communication channel. One or both of the interleaver and the de-interleaver includes a starting address register set, an offset register set, and a memory. Compared to many previous interleaver/de-interleaver systems, the present invention is operable using significantly reduced memory requirements. The present invention is operable to perform very efficient address generation corresponding to a number of delay lines that are employed in the interleaving and de-interleaving processes.

In certain embodiments, the present invention is operable to perform convolutional interleaving. The memory used in the present invention may be RAM. The present invention initializes using an interleaver depth value that may be used also to govern the parameters that govern the de-interleaving process as well. One such parameter is a delay increment for delay lines, as will be understood in light of the remainder of the disclosure. Using this interleaver depth value, the delay increment, and the code word size value, the values within the starting address register set and the offset register set may then be initialized. This may take place offline, if desired. The read/write processes may be performed in one or both of the interleaving and de-interleaving on a code word by code word basis or on a symbol by symbol basis. During the interleaving and de-interleaving, the values stored in the offset register set may be updated; the offset register set may be viewed as being a dynamic register set (whose values may change over time) whereas the starting address register set may be viewed as being a static register set (whose values are constant over time). The updating of the offset register set may take place on a code word by code word basis.

Also, it is noted that embodiments of the present invention may employ a number of delay lines, to perform interleaving and/or de-interleaving, that need not be arranged in a sequentially increasing and/or decreasing order. As will be understood by those persons having skill in the art, after reviewing the disclosure provided herein, the arrangement of the delay lines, when encountering various symbols, may appear somewhat as a zig-zag process through the number of delay lines stored in a matrix; this is a significant departure from the typically sequentially increasing and/or decreasing delay line lengths employed in many previous systems.

Various aspects of the present invention is operable within communication systems that perform encoding, interleaving, modulation, transmission across a communication channel, demodulation, de-interleaving, and decoding, as understood by those persons having skill in the art. In effect, the present invention is operable to perform interleaving, de-interleaving, and also provide for very efficient address generation therein, within any system that desires to perform convolutional interleaving and/or convolutional de-interleaving. The interleaving and/or de-interleaving as performed in accordance with the present invention is primarily geared towards RAM-based interleaving and/or RAM-based de-interleaving. Other processing elements may similarly be implements, including microprocessors, digital signal processors (DSPs), and other systems without departing from the scope and spirit of the invention.

The above-referenced description of the summary of the invention captures some, but not all, of the various aspects of the present invention. The claims are directed to some other of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

A better understanding of the invention can be obtained when the following detailed description of various exemplary embodiments is considered in conjunction with the following drawings.

FIG. 6 is a system diagram illustrating an embodiment of interleaving/de-interleaving that is performed in accordance with certain aspects of the present invention.

DETAILED DESCRIPTION OF THE INVENTION

The present invention is operable to provide for very efficient address generation for use in interleaving and de-interleaving. In one embodiment, the interleaving and de-interleaving is performed using RAM-based convolutional interleaving and de-interleaving, such that the interleaver behaves like W rows of delay lines, and de-interleaver like another W rows of delay lines. The present invention provides for great savings in terms of computational resources and memory. For example, one embodiment of the present invention uses only need two sets of W-element arrays (registers) for the address generation of a convolutional interleaver (or a convolutional de-interleaver). One W-element array, S, is used for storing starting memory addresses of each row of the delay lines in the random access memory. The other array, O, is for storing the address offsets of the current symbols to be written in or read from each delay line.

The present invention is operable within any number of application contexts including DSL, ADSL, VDSL, and satellite communication applications. In one example, in an asymmetrical digital subscriber line (ADSL) application, the register sizes of these arrays are adapted to implement the address generator of an interleaver (or de-interleaver) as following:

Array $S=255\times 8$ bits

Array $O=255\times 6$ bits

Those persons having skill in the art will appreciate that this is one example of how the interleaving and de-interleaving of the present invention is adapted to accommodate a particular application; other applications may similarly be accommodated without departing from the scope and spirit of the invention as well. The present invention is extendible to a variety of applications; in fact, the present invention is operable within any application seeking to perform convolutional interleaving and convolutional de-interleaving.

The contents of S are static during the interleaving operation (or de-interleaving operation), while the contents of O changes from clock cycle to clock cycle during the interleaving operation (or de-interleaving operation). The values of O may be changed on a code word by code word R/W basis, depending on the implementation.

For the interleaver design, the lengths of the delay lines need not necessarily be in increasing/decreasing order as the row number increases/decreases. That is to say, the lengths of the delay lines may be sequentially non-increasing and/or sequentially non-increasing. In addition, the symbols need not be written to the delay lines in a row-by-row sequential order. In general, each delay line may have a different delay (or length) from the other delay lines. The delays (or lengths)

of the delay lines of the interleaver (or de-interleaver) are governed by certain rules related to the code word size and interleaving depth, which will be elaborated in the following sections.

Figure 1:
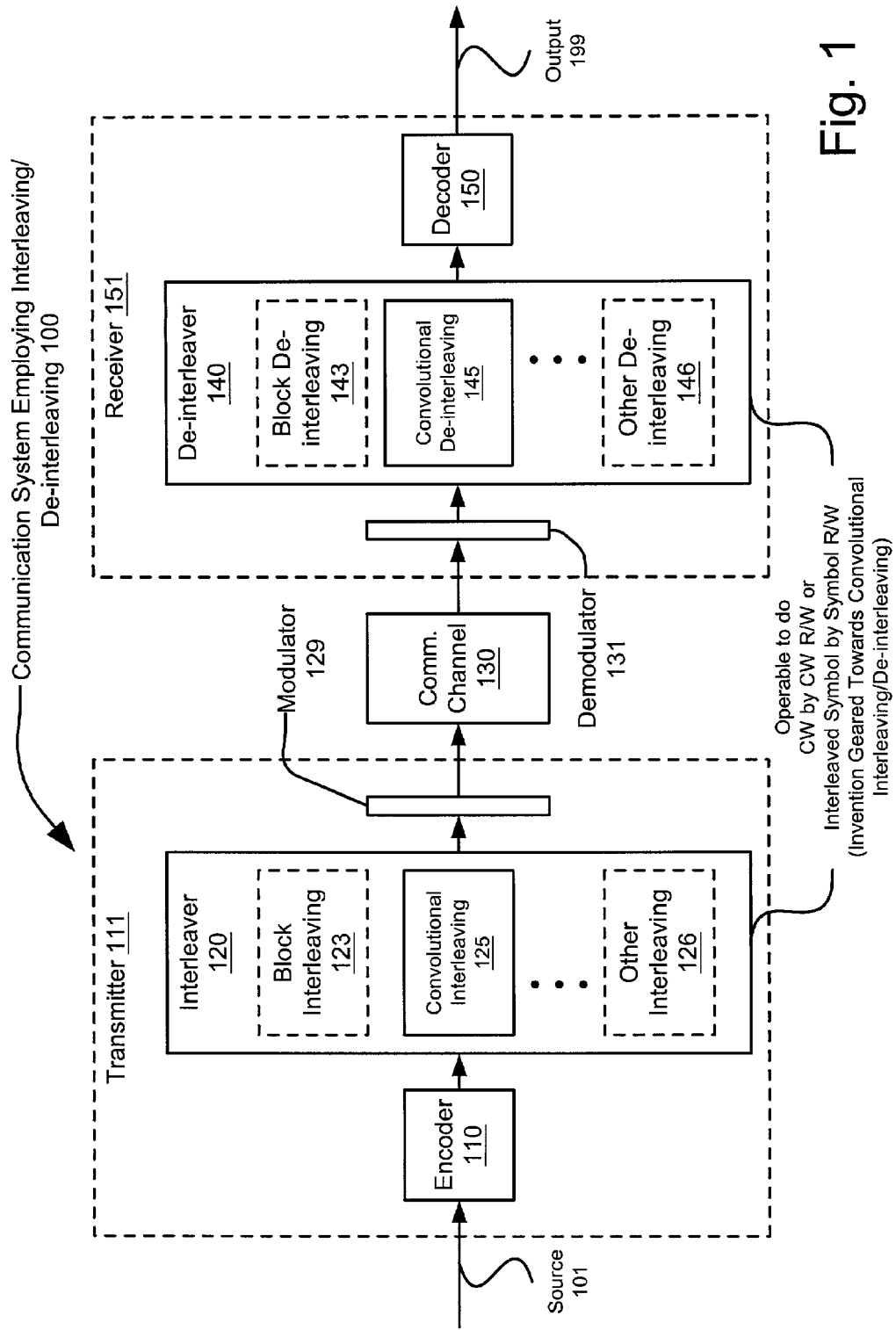
FIG. 1 is a system diagram illustrating an embodiment of a communication system, employing interleaving and de-interleaving, that is built in accordance with certain aspects of the present invention.

FIG. 1 is a system diagram illustrating an embodiment of a communication system 100, employing interleaving and de-interleaving, that is built in accordance with certain aspects of the present invention. The communication system 100 receives a data signal from a source as shown by source signal 101. The source signal 101 is provided to an encoder 110. The now encoded data is provided to an interleaver 120. The interleaver 120 is operable to perform any number of types of interleaving in accordance with certain aspects of the present invention. For example, the interleaver 120 may perform block interleaving 123, convolutional interleaving 125, . . . , and/or any other type of interleaving 126. It is also noted that the interleaver 120 is operable to perform interleaving in a code word by code word R/W manner or in an interleaved symbol by symbol R/W manner. The interleaver 120 provides output to a modulator for transmitting the data over a communication channel 130. The communication channel 130 may introduce a number of undesirable problems into the data being transmitted over it. For example, one problem is the introduction of burst type of noise, created by impulse type of events, that does not behave in a Gaussian manner.

A demodulator 131, at the other end of the communication channel 130, receives and demodulates the data. It is noted that the communication channels in the various embodiments of the present invention include wireline, wireless, fiber-optic and any other type of communication media as understood by those persons having skill in the art. Then, the demodulator 131 passes the data to a de-interleaver 140. Similar to the interleaver 120, the de-interleaver 140 is operable to perform de-interleaving using any number of various schemes, including block de-interleaving 143, convolutional de-interleaving 145, . . . , and/or any other type of de-interleaving 146. However, it is noted that the manner of de-interleaving is coupled to the manner of interleaving that is performed. For example, when convolutional interleaving is performed, then convolutional de-interleaving is performed for proper recovery of the data.

It is also noted that the de-interleaver 140 is operable to perform de-interleaving in a CW by CW read/write (R/W) manner or in an interleaved symbol by symbol R/W manner. Then, the de-interleaver passes the data to a decoder that generates output shown as an output signal 199. The output signal 199 is a substantial replica of the source signal 101. That is to say, the output signal 199 is ideally a perfect replica of the source signal 101. In addition, when error detection/correction techniques are employed, the output signal 199 may be transformed into a substantial replica of the source signal 101. Even when error are introduced into the data within the communication channel 130, the error detection/correction techniques may be employed to minimize those effects and transform the output signal 199 into (ideally) a replica of the source signal. In reality, however, the output signal 199 will not be an exact replica, but the bit error rate will typically be reduced due to error correction codes and interleaving/de-interleaving processes.

In alternative embodiments, a transmitter 111 is operable to perform encoding, interleaving, and modulation of the source signal 101. The transmitter 111 may be viewed as being a device that is operable to perform interleaving, encoding, and modulation in a single integrated device. However, those persons having skill in the art will appreciate that multiple devices may also operate cooperatively to perform the functionality of the transmitter 111; the transmitter 111 need not necessarily be a single integrated device. Regardless of where the interleaving is performed, the present invention is operable to provide interleaving across a wide variety of platforms and across a whole host of application areas where interleaving is performed.

It is also noted that the functionality performed by the modulator 129 and the demodulator 131 may be performed externally to either the transmitter 111 or the receiver 151, respectively.

Similarly, one embodiment of a receiver 151 is operable to perform demodulation, de-interleaving, and de-coding of the data received via the communication channel 130. However, the receiver 151 may perform only decoding of data received via the communication channel 130. The dotted line showing the receiver 151 is one embodiment where a single "encoder" includes a demodulator and a de-interleaver; clearly, an alternative embodiment may include a decoder on the front-end that decodes the data that is received via the communication channel 130 and then passes that data onto a de-interleaver.

The receiver 151 may be viewed as being a device that is operable to perform de-interleaving, decoding, and demodulation in a single integrated device. However, those persons having skill in the art will appreciate that multiple devices may also operate cooperatively to perform the functionality of the receiver 151; the receiver 151 need not necessarily be a single integrated device. Regardless of where the de-interleaving is performed, the present invention is operable to provide de-interleaving across a wide variety of platforms and across a whole host of application areas where de-interleaving is performed.

Ideally, the output signal 199 is duplicative of the source signal 101. However, as some errors may have been introduced during the transmission of the data over the communication channel, some error detection and/or error correction may be performed at the receiver end of the communication system 100. Any error detection and/or error correction may be performed in the demodulator 131, the de-interleaver 140, the decoder 150, or the receiver 151 without departing from the scope and spirit of the invention. While a given device may be operable to perform both block and convolutional interleaving/de-interleaving, the present invention is geared primarily towards and is operable to provide for more efficient implementation of the convolutional interleaving 125/convolutional de-interleaving 145. The convolutional interleaving/de-interleaving may be performed using RAM-based technologies, DSP-based technologies, and other hardware and software implementations without departing from the scope and spirit of the invention, as will be understood by those persons having skill in the art, and as described in the following description and Figures.

Figure 2:
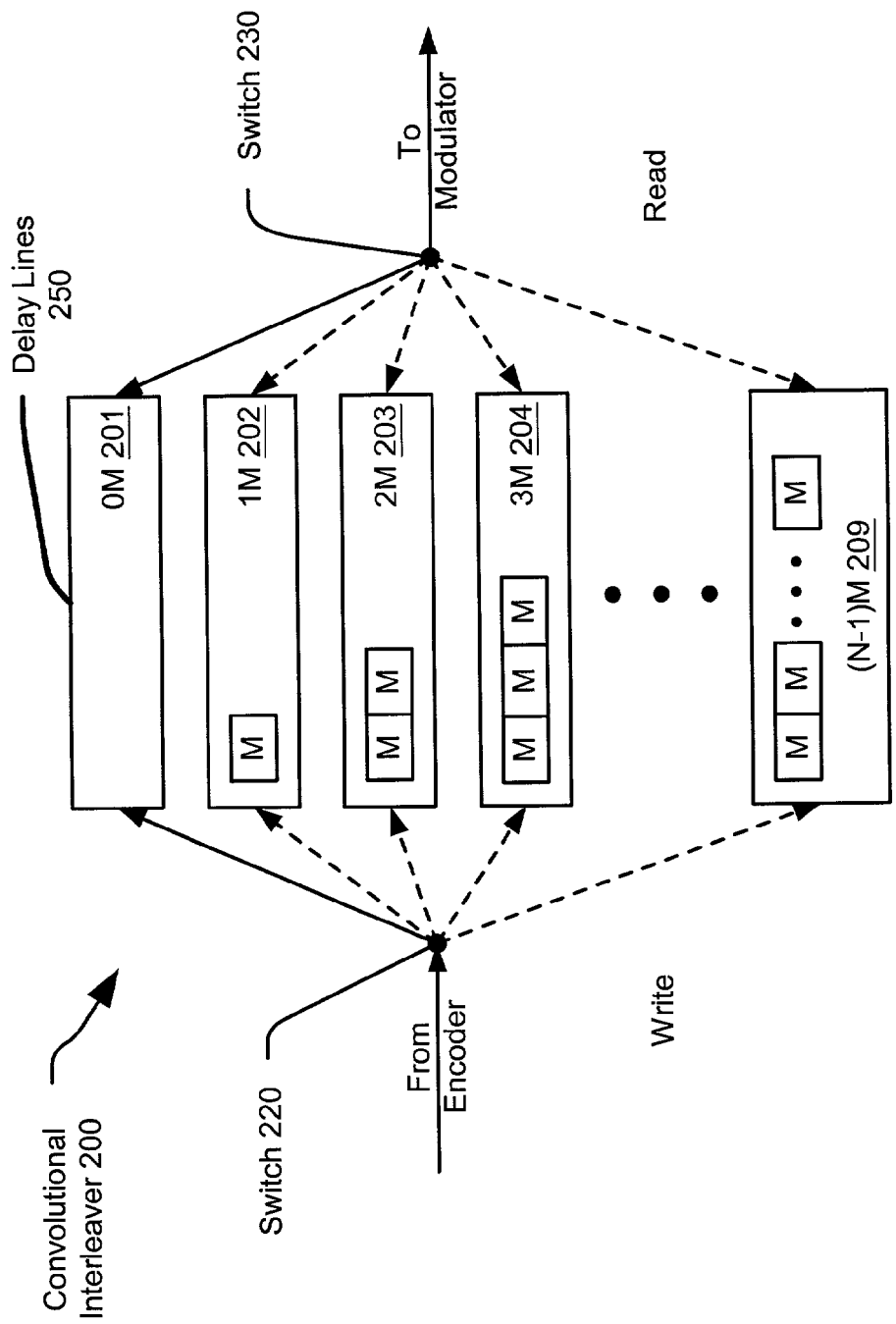
FIG. 2 is a system diagram illustrating an embodiment of a convolutional interleaver that is built in accordance with certain aspects of the present invention.

FIG. 2 is a system diagram illustrating an embodiment of a convolutional interleaver 200 that is built in accordance with certain aspects of the present invention. Data from an encoder is provided to a switch 220. The switch 220 is operable to provide data to any number of delay lines 250 within the convolutional interleaver 200. It is noted that the length of the delay lines are not necessarily in increasing order as the row number is increased, as will be shown in other embodiments. The embodiment shown in the FIG. 2 is shown in one such way for illustrative purposes and to convey the distribution of different delay line lengths within an interleaver. However, in various embodiments, the lengths of the delay lines may also be distributed in a different order as well without departing from the scope and spirit of the invention. For example, for even greater randomness in the interleaving process, the delay line lengths of the interleaver may be distributed in various orders, including various random orders.

In this embodiment, the switch 220 is operable to switch into any of the various delay lines 250, that have lengths varying from 0M (as shown in a functional block 201) to (N−1)M (as shown in addition functional block 209). The variable N and M are used to show the ability of the present invention to store a number of delay line lengths; it is understood that the lengths of the delay lines need not be in increasing and/or decreasing order, and the writing to the interleaver may not be in a row by row sequential order of delay lines. In this embodiment, k clock cycles are needed to switch out the delay line 250, as follows:

$$k = i \cdot M, \text{ as } i = 0 \ldots N-1$$

This is based largely on the length of the delays lines that are determined by the interleaver depth and code word size. The interleaver introduces a delay of the $i^{th}$ symbol by a delay of $(D-1) \times i$, where i is the symbol index in a code word.

The writing of data is performed on the left hand side of the convolutional interleaver 200, from the switch 220. Any various delay line length may be used for a particular portion of data, varying from no delay (as shown in the functional block 201), to a single delay 1M (as shown in a functional block 202), to a delay 2M (as shown in a functional block 203), to a delay 3M (as shown in a functional block 204), . . . , to the delay (N−1)M (as shown in the functional block 209). In other embodiments, the delays may not all be integral multiples of M, but those persons having skill in the art will appreciate that delays of various delay length may be employed without departing from the scope and spirit of the invention.

Analogously, a switch 230 is operable to read out data that has been written with any of the various delay line lengths, as shown in the functional blocks 201–209. The switch 230 switches in the interleaved data and provides it to a modulator in accordance with the present invention.

Figure 3:
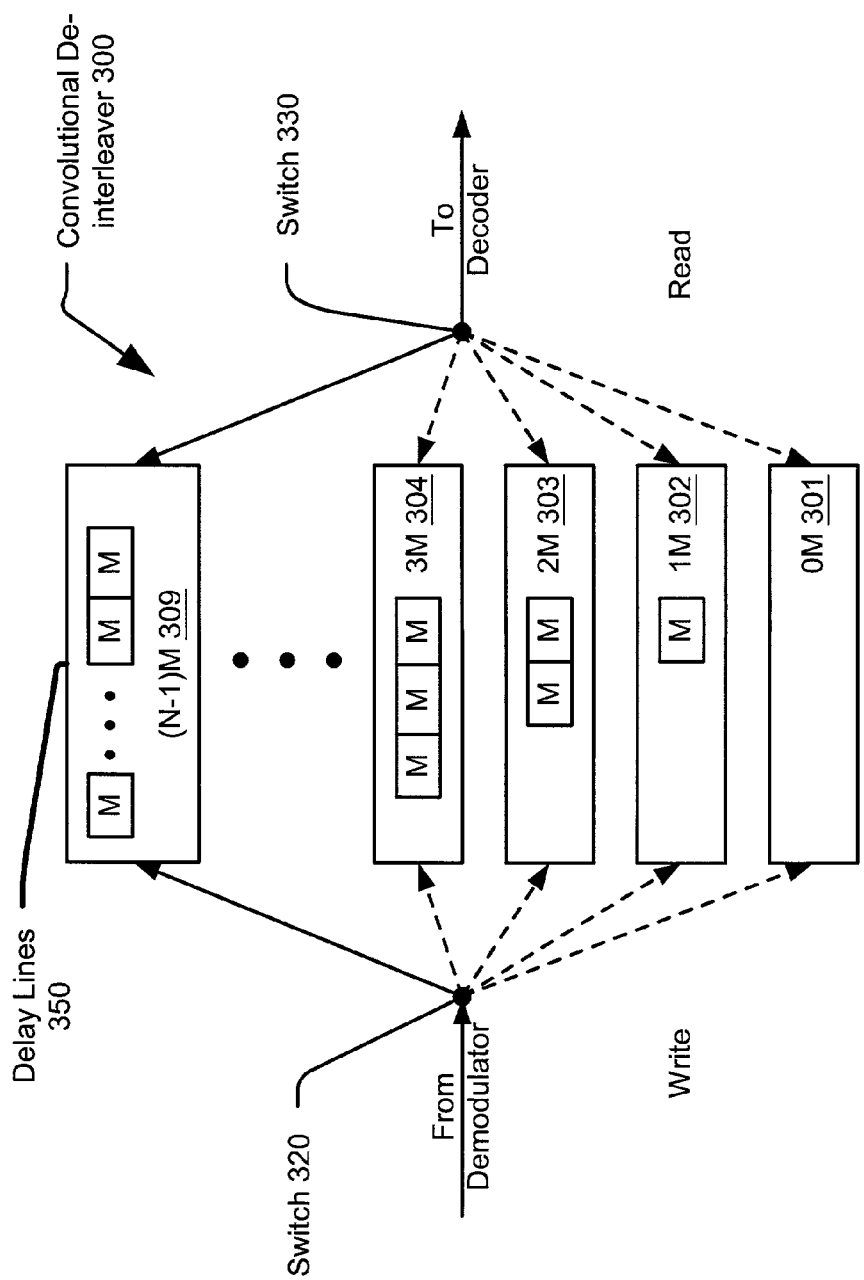
FIG. 3 is a system diagram illustrating an embodiment of a convolutional de-interleaver that is built in accordance with certain aspects of the present invention.

FIG. 3 is a system diagram illustrating an embodiment of a convolutional de-interleaver 300 that is built in accordance with certain aspects of the present invention. From certain perspectives, the convolutional de-interleaver 300 operates in the inverse of the convolutional interleaver 200 described above and in the FIG. 2. The convolutional de-interleaver 300 receives data from a demodulator at a switch 320. The switch 320 is operable to switch that data to any number of delay line lengths, shown by the delay lines 350 in the convolutional de-interleaver 300.

It is noted here for the de-interleaver of the FIG. 3 that the length of the delay lines are not necessarily in decreasing order as the row number is increased. The embodiment shown in the FIG. 3 is shown in one such way for illustrative purposes and to convey the distribution of different delay line lengths within a de-interleaver. However, in various embodiments, the lengths of the delay lines may also be distributed in a different order as well without departing from the scope and spirit of the invention. For example, the delay line lengths of the de-interleaver may be distributed in various orders, including various random orders. However, it is also noted that to perform proper de-interleaving of interleaved data, the manner in which the interleaving has been performed (within the interleaver) must be known by the de-interleaver, to ensure proper de-interleaving. That is to say, the interleaving and the de-interleaving must be complementary to ensure proper de-interleaving of the interleaved data.

In this embodiment, the switch 320 is operable to switch into any of the various delay lines 350, that have lengths varying from (N−1)M (as shown in addition functional block 309) to 0M (as shown in a functional block 301).

The writing of data is performed on the left hand side of the convolutional de-interleaver 300, from the switch 320. Any various delay line length may be used for a particular portion of data, varying from no delay (as shown in the functional block 301), to a single delay 1M (as shown in a functional block 302), to a delay 3M (as shown in a functional block 303), to a delay 3M (as shown in a functional block 304), . . . , to the delay of length (N−1)M (as shown in the functional block 309). N may be viewed as being a user-defined variable governing the length of the longest delay line in this embodiment.

A switch 330 is operable to read out data that has been written with any of the various delay line lengths, as shown in the functional blocks 301–309. The switch 330 switches in the now de-interleaved data and provides it to a decoder in accordance with the present invention.

Figure 4:
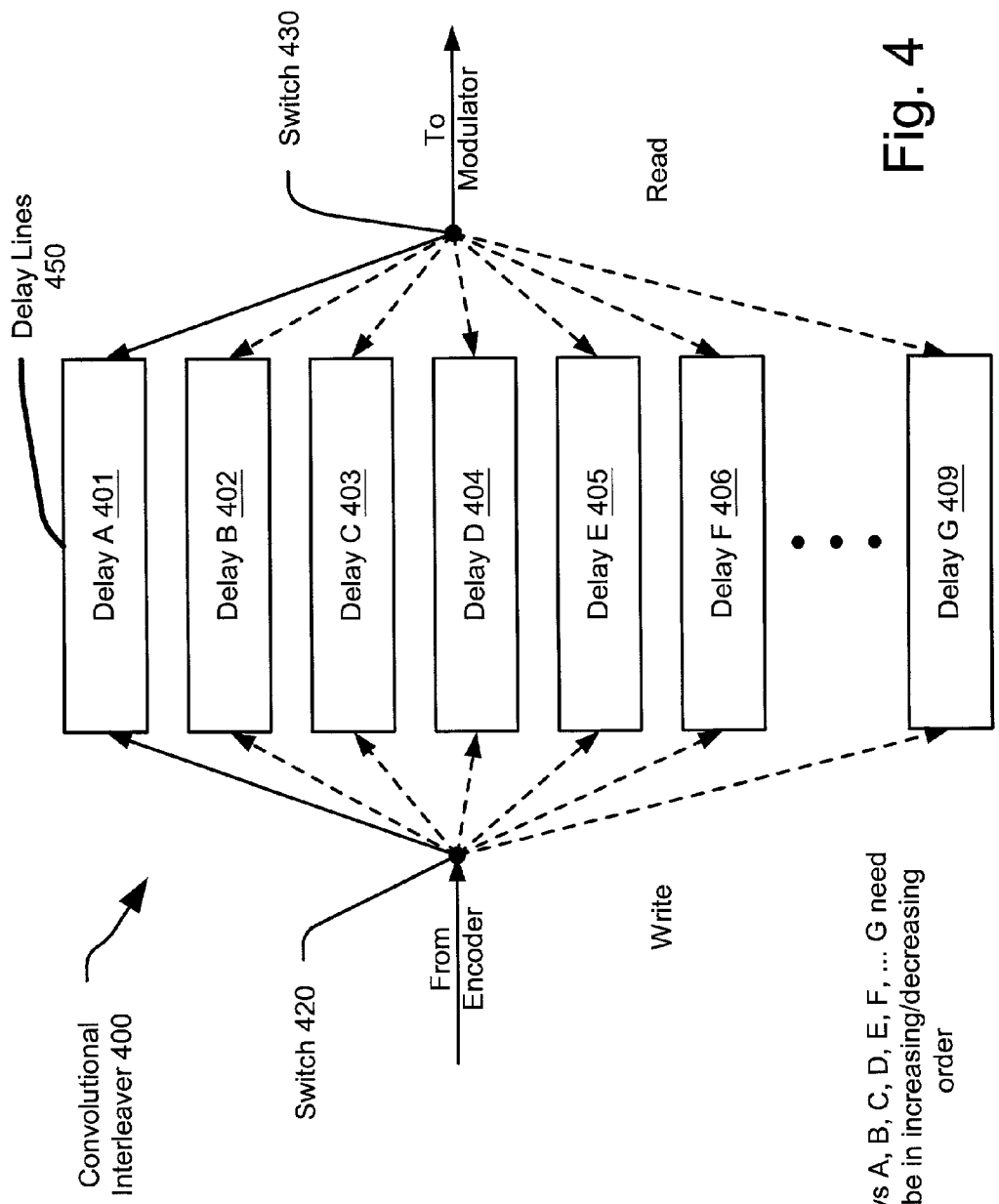
FIG. 4 is a system diagram illustrating another embodiment of a convolutional interleaver that is built in accordance with certain aspects of the present invention.

FIG. 4 is a system diagram illustrating another embodiment of a convolutional interleaver 400 that is built in accordance with certain aspects of the present invention. Data from an encoder is provided to a switch 420. The switch 420 is operable to provide data to any number of delay lines 450 within the convolutional interleaver 400. As mentioned above in other embodiments, the length of the delay lines are not necessarily in increasing order as the row number is increased, and the writing to the convolutional interleaver 400 may not be in a row by row sequential order of delay lines. The embodiment shown in the FIG. 4 shows delay lines 450, of various and different lengths, that are not in increasing or decreasing order. delay D 504, to a delay E 505, to a delay F 506, . . . , and to a delay G 509. The lengths of the delay lines 550 need not be in increasing or decreasing order.

It is also noted that to perform proper de-interleaving of interleaved data, the order of the interleaving must be known by the de-interleaver, to ensure proper de-interleaving. That is to say, the interleaving and the de-interleaving should be complementary to ensure proper de-interleaving of the interleaved data.

The writing of data is performed on the left hand side of the convolutional de-interleaver 500, from the switch 520. Any various delay line length may be used for a particular portion of data. Analogously, a switch 530 is operable to read out data that has been written with any of the various delay line lengths, as shown in the functional blocks 501–509. The switch 530 switches in the interleaved data and provides it to a decoder in accordance with the present invention.

The writing to the convolutional de-interleaver 500 may be performed in a row by row sequential order of delay lines. In any case, as described above, the manner in which the interleaving has been performed by the interleaver must be known by the de-interleaver to ensure proper de-interleaving of the data.

FIG. 6 is a system diagram illustrating an embodiment of interleaving/de-interleaving 600 that is performed in accordance with certain aspects of the present invention. This embodiment is geared for convolutional interleaving. Data is provided from an encoder, as understood by those persons having skill in the art, and provided to an interleaver 610.

The convention used in the following description is as follows:

The symbols of the code word (or data block) are numbered as i=0, . . . , W−1.

The interleaver 610 is operable to introduce a delay of the $i^{th}$ symbol by a delay of (D−1)×i clock cycles. The numbers W and D are co-prime numbers. Then, the output from the interleaver 610 is provided to a modulator 629, then to a communication channel 630. A demodulator 631 is communicatively coupled to the communication channel 630, and the demodulator 631 provides output to a de-interleaver 631. The de-interleaver 620 is operable to introduce a delay of the $i^{th}$ symbol by a delay of (D−1)×(W−i−1) clock cycles. The output of the de-interleaver is then passed to a decoder, as understood by those persons having skill in the art.

The effect of the above-described implementation is that the total delay for each symbol is a constant value (or substantially constant value), namely, (D−1)×(W−1) clock cycles. As will be understood by those persons having skill in the art, the present invention is operable using address pointing compared with the data shifting that is commonly used in some previous convolutional interleaving schemes. Using prior art schemes, it would require the use of twice as much RAM to implement the convolutional interleaving/de-interleaving that is performed in accordance with the present invention. Even those prior art schemes that provide for a more optimum use of RAM will require more registers for address generation that required by the present invention.

The data shifting is much more computationally intensive, in that, they commonly require the use of shift registers, compared with the schemes included within the scope and spirit of the invention.

The present invention, in this embodiment, is operable to accommodate various types of interleaving, including CW by CW R/W, as may be desired in various interleaver/de-interleaver applications. As will be seen, the address generation of the interleaving/de-interleaving, as performed in accordance with certain aspects of the present invention, is extremely efficient compared to those known and understood using previous schemes.

Figure 7A:
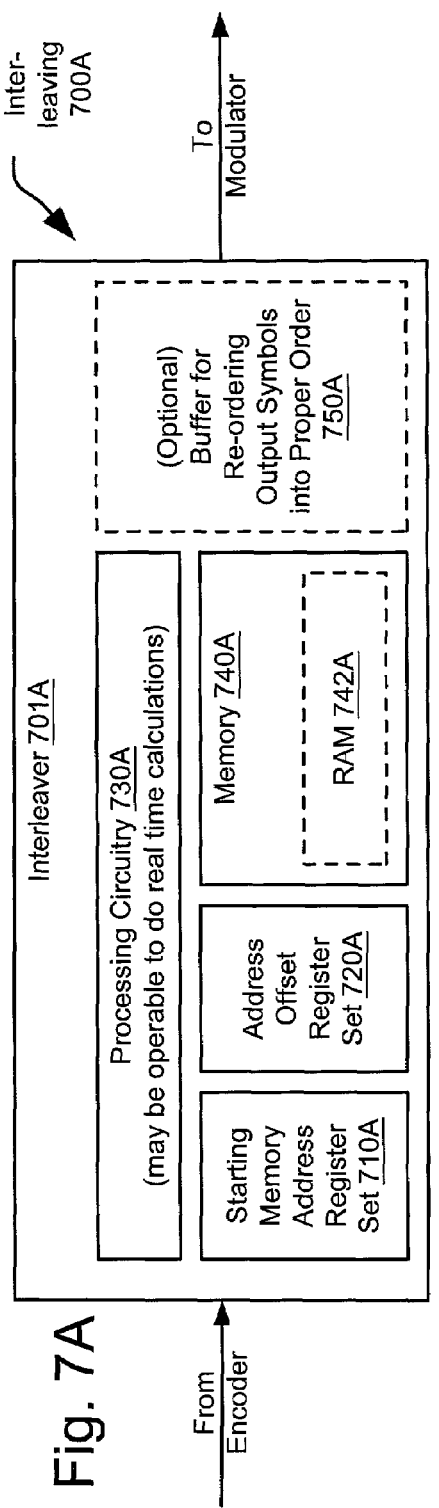
FIG. 7A is a system diagram illustrating another embodiment of interleaving that is performed in accordance with certain aspects of the present invention.

FIG. 7A is a system diagram illustrating another embodiment of interleaving 700A that is performed in accordance with certain aspects of the present invention. The interleaving 700A is shown as being performed using an interleaver 701A that receives data from an encoder; the interleaver 701A interleaves that data and provides it to a modulator. The interleaver 701A is operable with very minimal computational resources. A processing circuitry 730A may be employed. The processing circuitry 730A may be operable to perform real time calculations, or it may alternatively be operable to offload computations to co-processing circuitry to assist in the interleaving of the data. In addition, the interleaver 701A employs a memory 740A to store information concerning the delays to be given to various portions of data that are to be interleaved.

As will also be seen below in other embodiments, the delay lines will be effectuated by the addressing that is associated with the memory 740A. The memory 740A may be RAM 742A in some embodiments. In addition, the interleaver 701A employs two sets of registers, a starting memory address register set 710A and an address offset register set 720A. As will be described in other embodiments, the starting memory address register set 710A may be viewed as being a static register set in some embodiments, and the address offset register set 720A may be viewed as being a dynamic register set in some embodiments. It is also noted, as will be seen below in the embodiment of the FIG. 10, that some systems and methods may require a temporary buffer 750A to put the symbols that are output from the interleaver 701A into the proper order before transmitting them through the communication channel. This may be done before the symbol is passed to the modulator that precedes the communication channel.

The FIG. 7A shows the significantly reduced hardware requirements of interleaving 700A performed in accordance with the present invention when compared to those that use previous In this embodiment, the switch 420 is operable to switch into any of the various delay lines 450, that have lengths varying from a delay A 401, to a delay B 402, to a delay C 403, to a delay D 404, to a delay E 405, to a delay F 406, ..., and to a delay G 409. The lengths of the delay lines 450 need not be in increasing or decreasing order.

The writing of data is performed on the left hand side of the convolutional interleaver 400, from the switch 420. Any various delay line length may be used for a particular portion of data. Analogously, a switch 430 is operable to read out data that has been written with any of the various delay line lengths, as shown in the functional blocks 401–409. The switch 430 switches in the interleaved data and provides it to a modulator in accordance with the present invention. The lengths of the delay lines that are used for both the interleaving and de-interleaving processes follow certain rules that operate together to ensure that the data is properly interleaved and de-interleaved.

Figure 5:
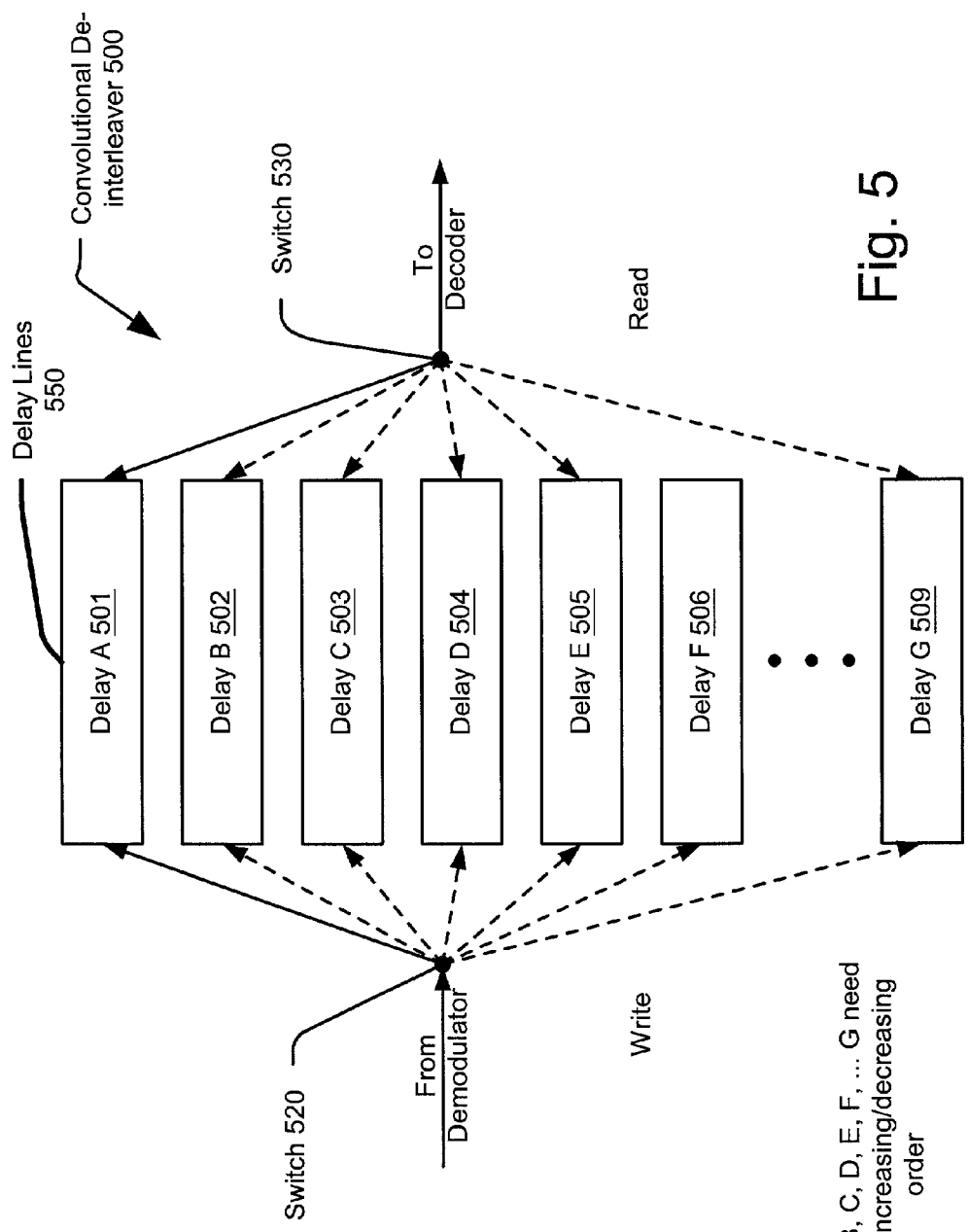
FIG. 5 is a system diagram illustrating another embodiment of a convolutional de-interleaver that is built in accordance with certain aspects of the present invention.

FIG. 5 is a system diagram illustrating another embodiment of a convolutional de-interleaver that is built in accordance with certain aspects of the present invention. From certain perspectives, the convolutional de-interleaver 500 operates in the inverse of the convolutional interleaver 400 described above and in the FIG. 4. The convolutional de-interleaver 500 receives data from a demodulator at a switch 520. The switch 520 is operable to switch that data to any number of delay line lengths, shown by the delay lines 550 in the convolutional de-interleaver 500. As mentioned above in other embodiments, the length of the delay lines are not necessarily in increasing order as the row number is increased. The embodiment shown in the FIG. 5 shows delay lines 550, of various and different lengths, that are not in increasing or decreasing order.

In this embodiment, the switch 520 is operable to switch into any of the various delay lines 550, that have lengths varying from a delay A 501, to a delay B 502, to a delay C 503, to a methods. The interleaving 700A may be implemented using a mere two register sets to perform the address generation employed in interleaving using the present invention.

Figure 7B:
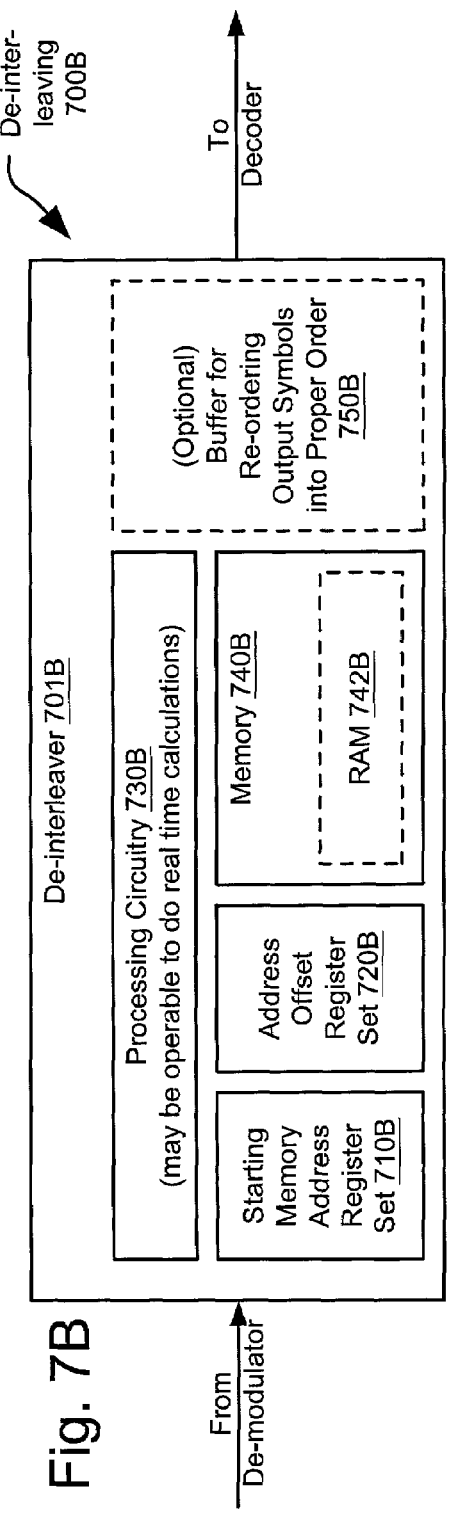
FIG. 7B is a system diagram illustrating another embodiment of de-interleaving that is performed in accordance with certain aspects of the present invention.

FIG. 7B is a system diagram illustrating another embodiment of de-interleaving 700B that is performed in accordance with certain aspects of the present invention. The de-interleaving 700B is shown as being performed using a de-interleaver 701B that receives data from a demodulator; the de-interleaver 701B de-interleaves that data and provides it to a decoder. The de-interleaver 701B is also operable with very minimal computational resources. A processing circuitry 730B may be employed. The processing circuitry 730B may be operable to perform real time calculations, or it may alternatively be operable to offload computations to co-processing circuitry to assist in the de-interleaving of the data. In addition, the de-interleaver 701B employs a memory 740B to store information concerning the delays to be given to various portions of data that are to be de-interleaved.

As will also be seen below in other embodiments, the delay lines will be effectuated by the addressing that is associated with the memory 740B. The memory 740B may be RAM 742B in some embodiments. RAM is often desirable in many applications because of the decreased die size when compared to shift registers that typically consume a large amount of real estate in Silicon. RAM offers a solution that consumes less die size by employing more gates. In addition, the de-interleaver 701B employs two sets of registers, a starting memory address register set 710B and an address offset register set 720B. As will be described in other embodiments, the starting memory address register set 710B may be viewed as being a static register set in some embodiments, and the address offset register set 720B may be viewed as being a dynamic register set in some embodiments. It is also noted, as will be seen below in the embodiment of the FIG. 11, that some systems and methods may require a temporary buffer 750B to put the symbols that are output from the de-interleaver 701B into the proper order before presenting them to the decoder. This needs to be done before the symbol is passed to the decoder.

The FIG. 7B shows the significantly reduced hardware requirements of de-interleaving 700B performed in accordance with the present invention when compared to those that use previous methods. The de-interleaving 700B may be implemented using a mere two register sets to perform the address generation employed in de-interleaving using the present invention.

Figure 8:
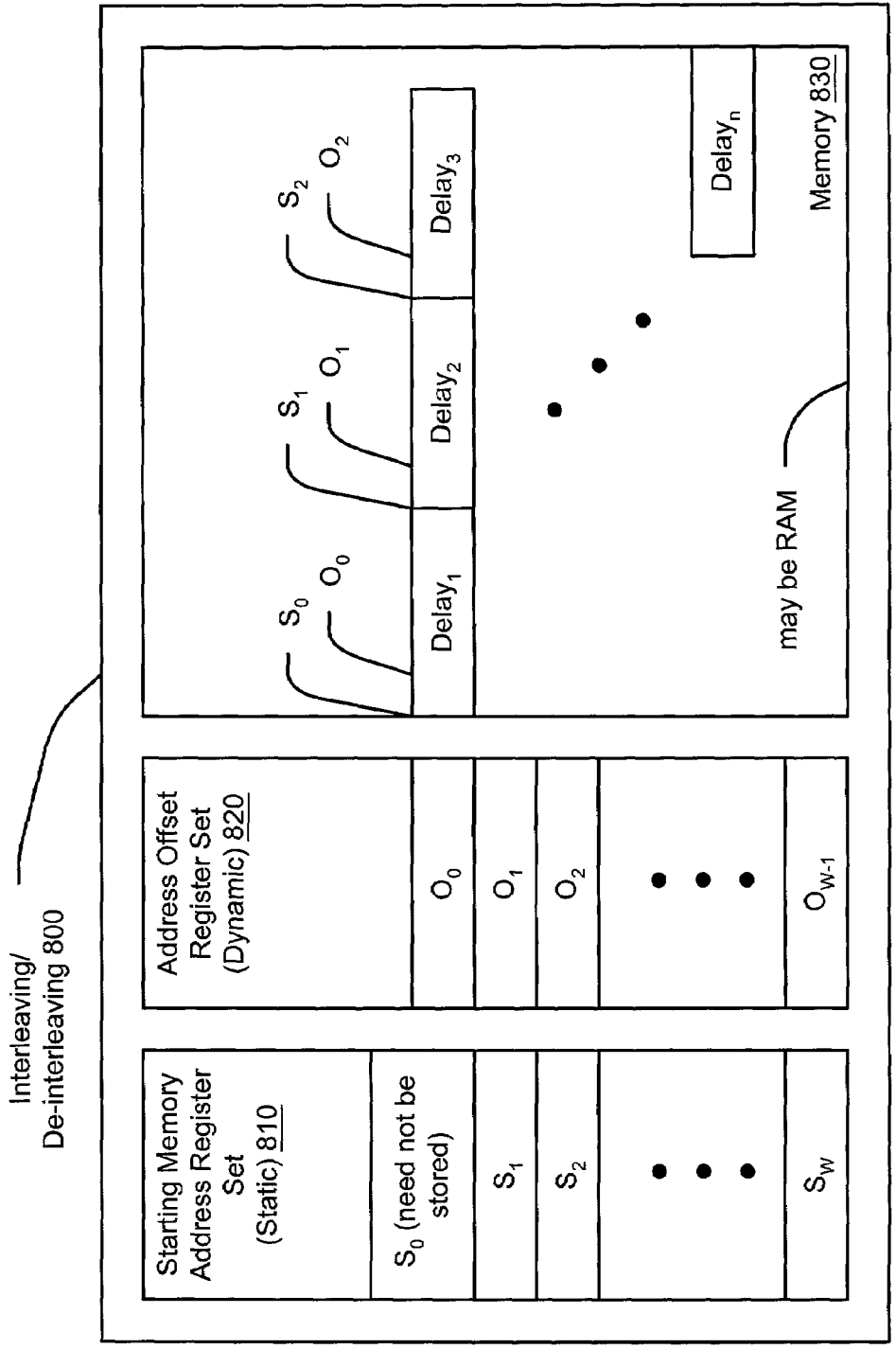
FIG. 8 is a system diagram illustrating another embodiment of interleaving/de-interleaving that is performed in accordance with certain aspects of the present invention.

FIG. 8 is a system diagram illustrating another embodiment of interleaving/de-interleaving 800 that is performed in accordance with certain aspects of the present invention. The FIG. 8 shows, in even greater detail, the implementation of two register sets to perform interleaving/de-interleaving in accordance with the present invention. One of the register sets is a starting memory address register set 810 that is static in nature (shown as the values of $S_0, S_1, S_2, \ldots,$ and $S_W$). The other register set is an address offset register set 820 that is dynamic in nature (shown as the values of $O_0, O_1, O_2, \ldots,$ and $O_{W-1}$).

The values stored in the starting memory address register set 810 may be generated offline, and the initial values stored in the address offset register set 820 may be generated offline. However, the values stored in the address offset register set 820 will be updated during R/W cycles during the interleaving and de-interleaving. In addition, the value stored for $S_0$ need not necessarily be stored, as it's value is zero in certain embodiments; this situation can be accommodated via programming and/or processing. Since this particular case is known, it can be accommodated without necessitating storage of this null data.

From certain perspectives, the delays (shown as a delay$_1$, a delay$_2$, a delay$_3$, ... and a delay$_n$) to be employed in either one of the interleaving/de-interleaving are generated by the particular addressing schemes that are employed in memory 830. It is the particular addressing of the memory 830 that effectuates the delay lines in various embodiments. The memory 830 may be RAM in some embodiments. The delays themselves are effectuated by the addressing in the memory 830. The values stored in the starting memory address register set 810 assist in finding where the beginnings of the various delays that are effectuated in the memory 830. The values stored in the address offset register set 820 are for providing the address offsets of the current symbols to be written in or read from each delay line that is effectuated by the addressing in the memory 830.

Again, as shown in other embodiments, the FIG. 8 also shows the significantly reduced hardware requirements of interleaving/de-interleaving 800 that may be performed in accordance with the present invention when compared to those that use previous methods. The interleaving and the de-interleaving of the interleaving/de-interleaving 800 may each be implemented using two W element register sets to perform the address generation employed in interleaving/de-interleaving using the present invention.

Figure 9:
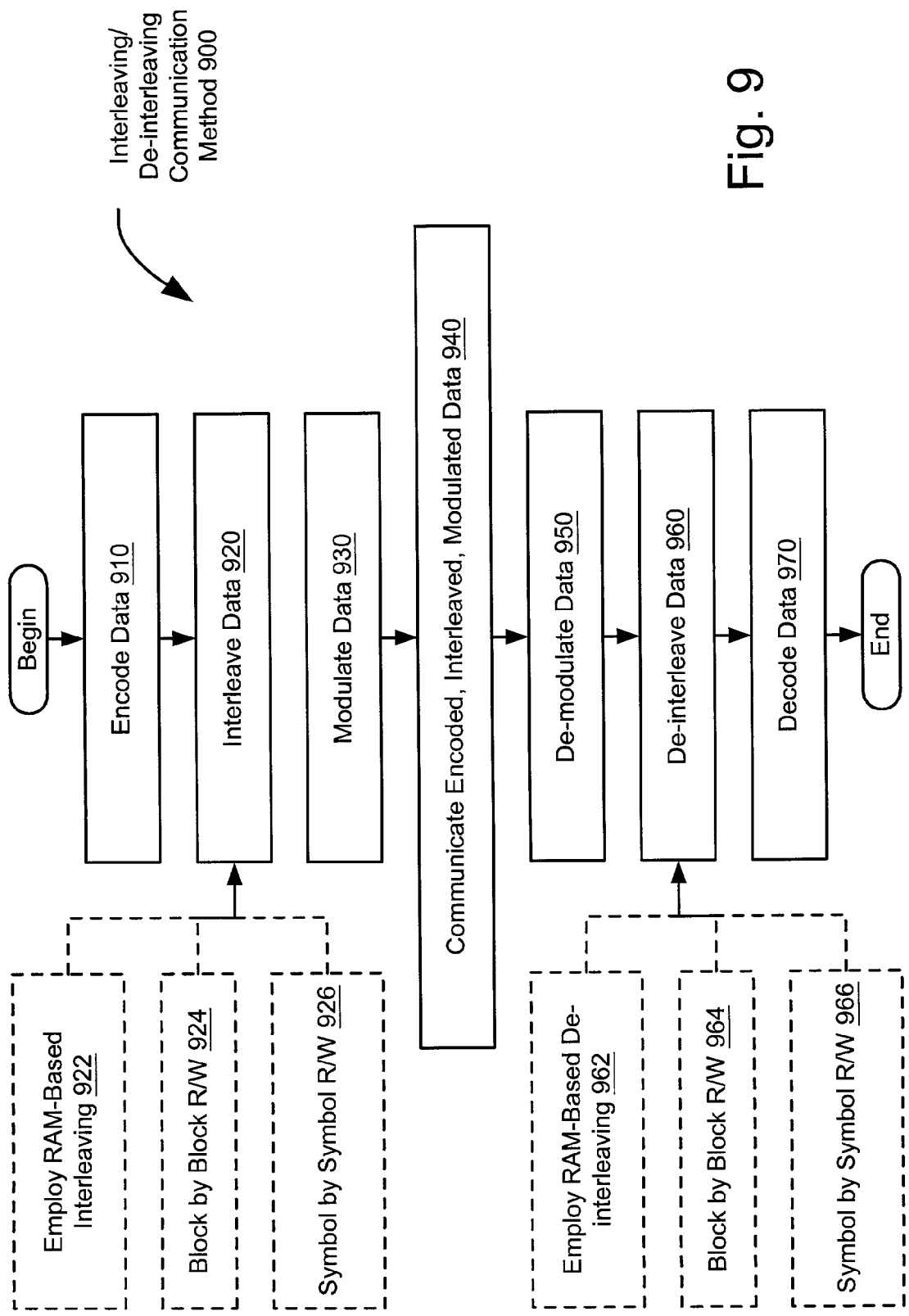
FIG. 9 is a functional block diagram illustrating an embodiment of an interleaving/de-interleaving communication method that is performed in accordance with certain aspects of the present invention.

FIG. 9 is a functional block diagram illustrating an embodiment of an interleaving/de-interleaving communication method 900 that is performed in accordance with certain aspects of the present invention. The operation of the interleaving/de-interleaving communication method 900 begins at the transmitter end of a communication channel. In a block 910, data is encoded. Then, in a block 920, that data is interleaved using any of the interleaving schemes included within the scope and spirit of the invention. The interleaving may be performed using RAM-based interleaving, as shown in a functional block 922. Alternatively, the interleaving may be performed on a block by block R/W basis (or, stated another way, on a code word (CW) by code word (CW) basis), as shown in a functional block 924, or the interleaving may be performed using a symbol by symbol R/W basis, as shown in a functional block 926.

Then, in a block 930, the data is modulated for transmission over a communication channel. Then, the now encoded, interleaved, and modulated data is communicated over a communication channel 940. Then, at the receiver end of the communication channel, the data identification demodulated as shown in a functional block 950. Then, the data is de-interleaved in a block 960. Similar to the various manners in which the interleaving of the data may be performed as shown above in the block 920, the de-interleaving of the block 960 may also be performed using various schemes. For example, the de-interleaving may be performed using RAM-based de-interleaving, as shown in a functional block 962. Alternatively, the de-interleaving may be performed on a block by block R/W basis (or, stated another way, on a code word (CW) by code word (CW) basis), as shown in a functional block 964, or the de-interleaving may be performed using a symbol by symbol R/W basis, as shown in a functional block 966. Then, the data is decoded in a block 970. The FIG. 9 shows, from yet another overview perspective, the operation of the various interleaving and de-interleaving that is performed using certain aspects of the present invention. Other details of other interleaving and de-interleaving methods will be further described in other embodiments as well.

The embodiments described below in the FIGS. 10 and 11 allows the implementation of interleaving and de-interleaving that is adaptable to require a minimum amount memory. The interleaver and de-interleaver methods described below may be implemented using RAM-based techniques, if desired. The sum of the size of interleaver and de-interleaver is equal to $(D-1) \times W$. In this embodiment, every write of the interleaver (or de-interleaver) needs a corresponding read operation that precedes the write operation. Additionally, the symbols, read from the interleaver or de-interleaver, are not in a proper timing sequence. To deal with this, a separate buffer may be employed to put the symbols in the proper timing order.

Figure 10:
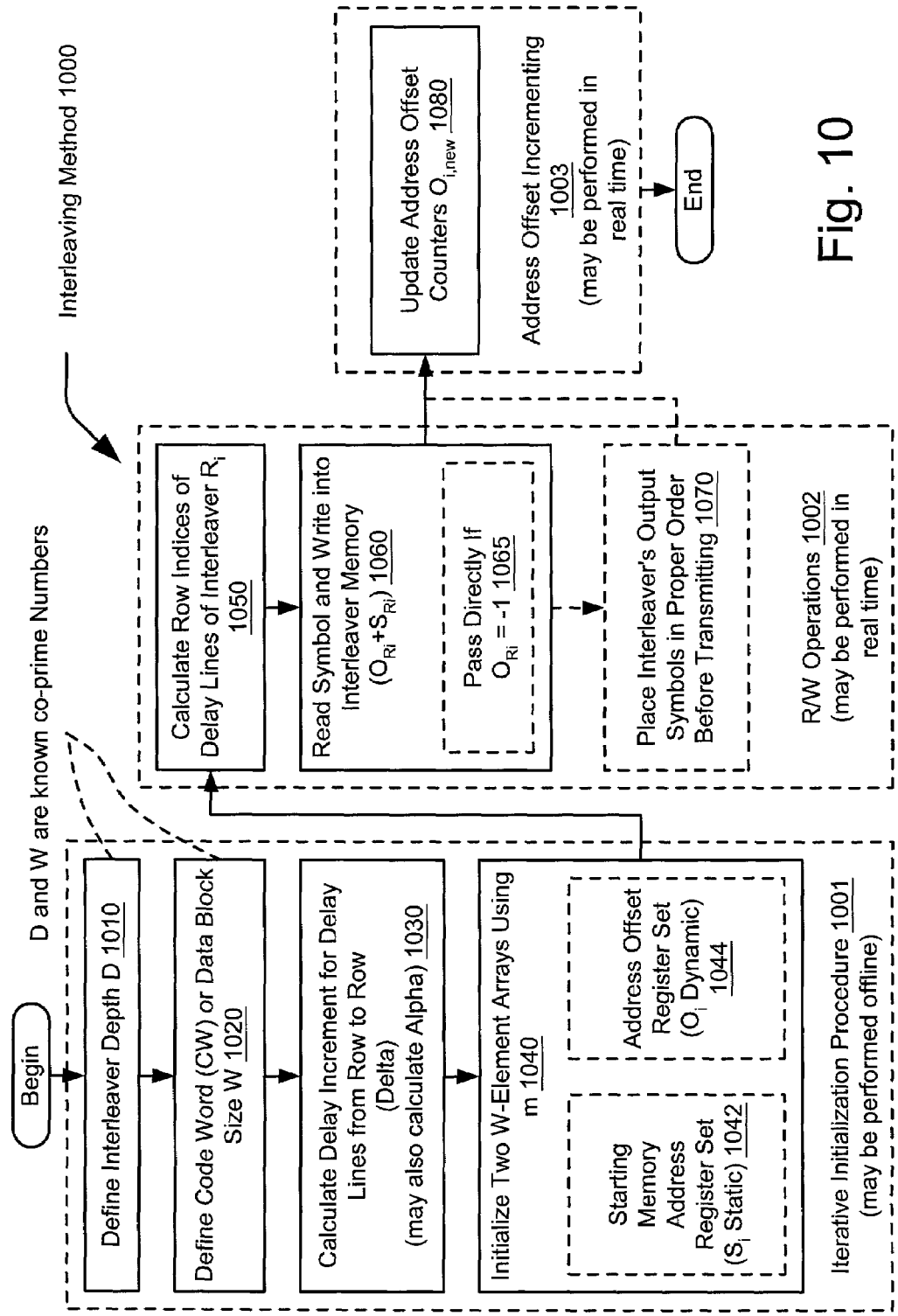
FIG. 10 is a functional block diagram illustrating an embodiment of an interleaving method that is performed in accordance with certain aspects of the present invention.

FIG. 10 is a functional block diagram illustrating an embodiment of an interleaving method 1000 that is performed in accordance with certain aspects of the present invention. The method described in the FIG. 10 is operable to perform calculations of the starting addresses, offset addresses, and lengths of the delay lines.

The following iterative initialization procedure 1001 may be performed offline, in an effort to preserve and save processing and computational resources for systems employing the interleaving method 1000.

To begin, the interleaving depth D must be defined, as shown in a block 1010 and a code word (or data block) size must be defined, as shown in a block 1020. The FIG. 10 also describes how the interleaving method 1000 may be performed including the updating of the read and write (R/W) address pointers.

a) The first step is to find the delay increment Δ from row to row. This parameter can be solved from the following equation:

$$\alpha \times D - \Delta \times W = 1 \quad (1)$$

Where D is the interleaver depth, W is the code word size (or block size). Both D and W have been defined above. The values α and Δ are two minimum positive integers satisfying this equation. Both α and Δ are unknown initially, and that D and W are known co-prime numbers (it means the only common factor between D and W is 1). From certain perspectives, the values of D (interleaver depth) and W (code word size or block size) are linearly combined, each having a respective coefficient, thereby summing to a constant value.

Under these conditions, Δ and α can be solved uniquely (see appendix for proof). It can be shown that Δ is the delay increment for the delay lines from row to row. Both α and Δ may be calculated, as shown in a block 1030, yet only the value Δ is required, as Δ may be represented in terms of α. Other embodiments that can be calculated from equation (1) are included within the scope and spirit of the invention. Once Δ is found, the next step is to initialize the two W-element arrays (in a block 1040): S, the starting addresses for each delay line in the memory (that may be RAM) as shown in a block 1042; and O, the address offset counters for each delay line as shown in a block 1044. The following equations show how to accomplish this:

Define a temporary variable $m_i$ used in the iterative initialization procedure as $$m_i = \begin{cases} 0 & \text{for } i = 0 \\ (m_{i-1} + \Delta)\%D & \text{for } i \neq 0 \end{cases} \quad i = 0 \ldots W \quad (2)$$

Where % is the modulo operator. Then, the procedure assigns elements of S and O array as $$S_i = \begin{cases} 0 & \text{for } i = 0 \\ S_{i-1} + m_i & \text{for } i \neq 0 \end{cases} \quad i = 0 \ldots W \quad (3)$$

$$O_i = S_{i+1} - S_i - 1 \quad i = 0 \ldots W-1 \quad (4)$$

Note: $S_0$ is always zero and does not need to be stored in a register.

The following R/W operations 1002 may be performed in real time within the interleaving method 1000.

b) Read and write operations: Assuming the input data block contains data symbols $c_1, C_2, C_3, \ldots c_w$, where i is time index. Writing input symbols to the interleaver is not in a row-by-row sequential order of the delay line matrix. Let $R_i$ be the row index of the delay lines of the interleaver to be written to, $R_i$ is determined by the following equation:

$$R_i = \begin{cases} 0 & i = 0 \\ (R_{i-1} + D)\%W & i \neq 0, \text{ for } i = 1 \ldots W-1. \end{cases} \quad (5)$$

After calculating $R_i$, as shown in a block 1050, if $O_{R_i}$ is equal to −1, then the input symbol is directly passed to the interleaver output, as shown in a block 1065. Otherwise, in a block 1060, a symbol is read from the location $O_{R_i} + S_{R_i}$ before the input symbol is written in the interleaver memory at address $O_{R_i} + S_{R_i}$. It is noted that a symbol at the output of the interleaver may not be with time index i. In fact, it is with time index $R_i$. Therefore, at the output of interleaver, a W element temporary buffer may be employed to put the output symbols from the interleaver in proper order before transmitting through the communication channel, as shown in a block 1070.

The following address offset incrementing 1003 may be performed in real time within the interleaving method 1000. In addition, the real time incrementing (or updating) within the functional block 1003 may be viewed as being quasi-real time, as it may be performed on a code word by code word basis (stated another way, a block by block basis) and not on a R/W cycle basis per se.

c) Increment of address offsets: after reading and writing the interleaver a complete code word (or data block), the address offset counters for each delay line need to be updated, as shown in a block 1080, and as described as follows:

$$O_{i,new} = \begin{cases} O_{i,old} + 1 & \text{if } S_i + O_{i,old} + 1 < S_{i+1}, \text{ and } O_{i,old} \neq -1 \\ 0 & \text{if } S_i + O_{i,old} + 1 \geq S_{i+1}, \text{ and } O_{i,old} \neq -1 \\ -1 & \text{if } O_{i,old} = -1 \end{cases} \quad (6)$$

Where i runs from 0 to W−1.

Those persons having skill in the art will appreciate that the delays, encountered by symbols during the interleaving process may be viewed as traversing through a number of available delay lines stored in a matrix, may be viewed as being selected in a zig-zag manner.

Figure 11:
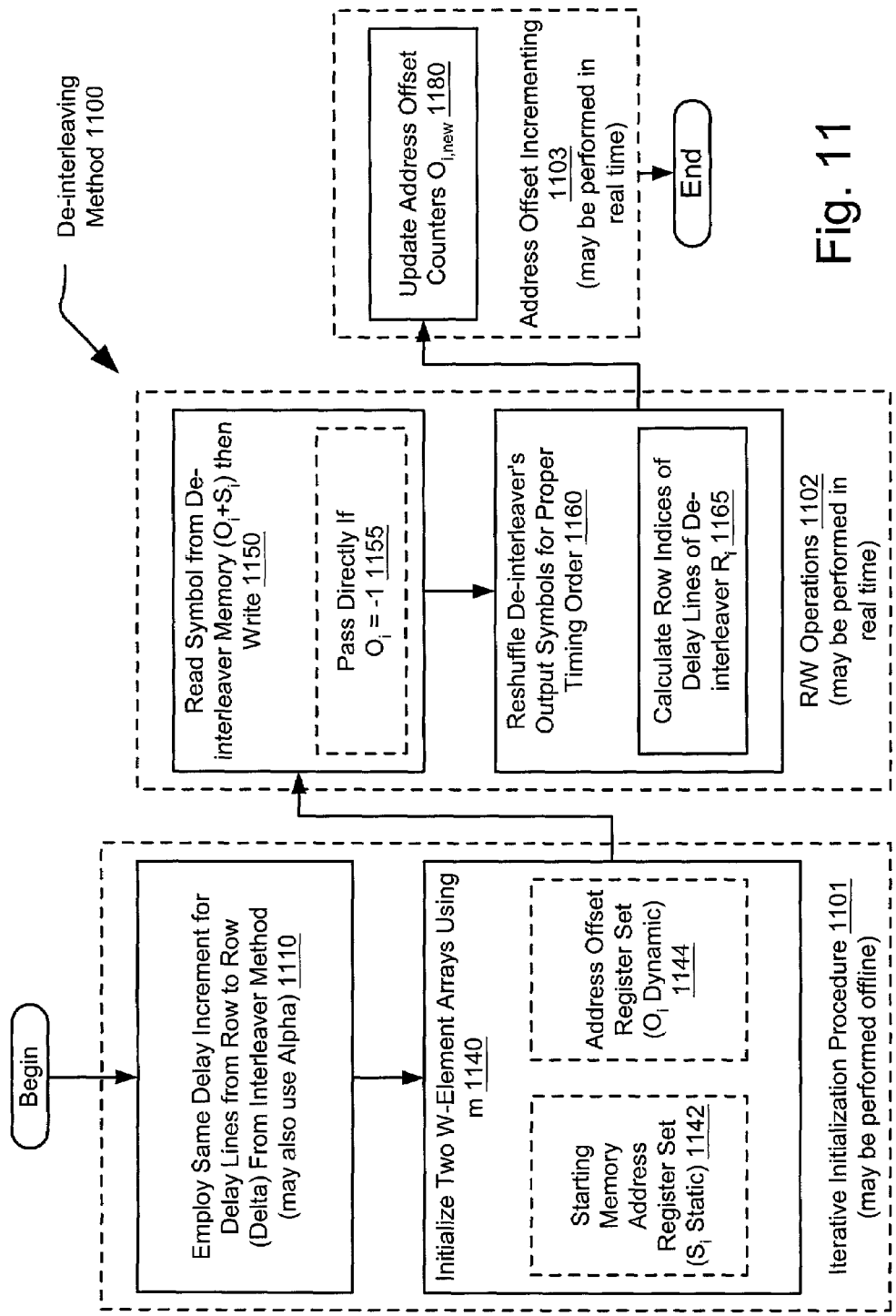
FIG. 11 is a functional block diagram illustrating an embodiment of a de-interleaving method that is performed in accordance with certain aspects of the present invention.

FIG. 11 is a functional block diagram illustrating an embodiment of a de-interleaving method 1100 that is performed in accordance with certain aspects of the present invention. The de-interleaving method 1100 is similar to the interleaving method 1000, it and can be described in the following steps.

The following iterative initialization procedure 1101 may be performed offline, in an effort to preserve and save processing and computational resources for systems employing the de-interleaving method 1100.

a) The first step, as shown in a block 1110, is to use the same delay increment parameter Δ (and also a, if desired) found by solving equation (1). Then, in a block 1140, the two W-element arrays are initialized using m: S—starting addresses for each delay line in the memory (that may be RAM) as shown in a block 1142; O—address offset counters for each delay line as shown in a block 1144. The following equations show how to accomplish this:

$$m_i = \begin{cases} 0 & \text{for } i = 0 \\ (m_{i-1} + \Delta)\%D & \text{for } i \neq 0 \end{cases} \quad i = 0 \ldots W \quad (7)$$

$$S_i = \begin{cases} 0 & \text{for } i = 0 \\ S_{i-1} + D - m_i - 1 & \text{for } i \neq 0 \end{cases} \quad i = 0 \ldots W \quad (8)$$

$$O_i = S_{i+1} - S_i - 1 \quad i = 0 \ldots W-1 \quad (9)$$

Where % is the modulo operator. Since $S_0$ is always 0, it doesn't need to be stored in a register.

The following R/W operations 1102 may be performed in real time within the de-interleaving method 1100.

b) Writing symbols to the de-interleaver memory (that may be RAM) is code word by code word (or data block by data block) and in a row-by-row sequential order of the delay lines. The symbols at the output of the de-interleaver need to be reshuffled for proper timing order as shown in a block 1160. This can be done with a W element temporary output buffer to put the output symbols in order. The symbol read from $R_i^{th}$ row of the delay-lines need to be placed at the $i^{th}$ position on the output buffer. It is noted that "$R_i$" is the index of the rows of the delay lines; "$R_i$" is the symbol position to read from the temporary buffer and to place the symbol at the "$i^{th}$" position of the output buffer. This operation is the reverse of the operation within the interleaver. The R/W indices are calculated as shown in a block 1165 and as described in equation 10 below. If $O_i$ is equal to $-1$, then the symbol is directly placed in the de-interleaver's temporary buffer, as shown in a block 1155, before undergoing reshuffling in the block 1160. Otherwise the writing needs to be preceded by a read operation at the same address that is equal to $O_i+S_i$ as shown in a block 1150 and put that symbol into the temporary buffer at the $i^{th}$ position. $R_i$ can be calculated with the following equation:

$$R_i = \begin{cases} 0 & i = 0 \\ (R_{i-1} + D)\%W & i \neq 0, \text{ for } i = 1 \ldots W - 1. \end{cases} \quad (10)$$

The following address offset incrementing 1103 may be performed in real time within the de-interleaving method 1100. In addition, the real time incrementing (or updating) within the functional block 1103 may be viewed as being quasi-real time, as it may be performed on a code word by code word basis (stated another way, a block by block basis) and not on a R/W cycle basis per se.

c) Increment of address offsets: after reading and writing the de-interleaver a complete code word (or block), the address offset counters for each delay line need to be updated, as shown in a block 1180, and as described as follows:

$$O_{i,new} = \begin{cases} O_{i,old} + 1 & \text{if } S_i + O_{i,old} + 1 < S_{i+1}, \text{ and } O_{i,old} \neq -1 \\ 0 & \text{if } S_i + O_{i,old} + 1 \geq S_{i+1}, \text{ and } O_{i,old} \neq -1 \\ -1 & \text{if } O_{i,old} = -1 \end{cases} \quad (11)$$

where i runs from 0 to W−1.

It is also noted that the sum of the sizes of the memories needed for optimum design of an interleaver and a de-interleaver is M=(D−1)*W. For example D=8 and W=13, the interleaver needs 42 elements, and the de-interleaver needs 49 elements. Notice, the size of individual interleaver memory (or de-interleaver memory) may itself exceed (D−1)*W/2.

In the previous embodiments of the present invention described in the FIGS. 10 and 11, a write operation to the interleaver (or de-interleaver) must be preceded by a read operation from the interleaver (or de-interleaver). Other applications may prefer not to operate according to this constraint. In this sections below describing even other embodiments of the present invention, an alternative embodiment that allows read and write operations to be independently carried out in block fashion are described. However, the memory usage is different than in the previous embodiment of the FIGS. 10 and 11, and it may not be viewed as being minimal in certain implementations. The sum of memory usage for both an interleaver and a de-interleaver that operate to perform the methods described in the FIGS. 12 and 13 is shown as follows:

$$M = (D+1) \cdot W$$

Here, D is the interleaving depth, and W is the number of symbols in one code word (or data block). A benefit is that the interleaver operation (or de-interleaver operation) does not require read first and then write for every symbol. For example, to implement a convolutional interleaver for an application where (W=255 and D=64), the total memory size required is 255*65=16575 bytes for the interleaver and the de-interleaver. The interleaver memory alone is about half of this number. This implementation is very similar to that in previous section and as described in the FIGS. 10 and 11, and the address generation of either the interleaver or the de-interleaver also uses two W-element registers.

Figure 12:
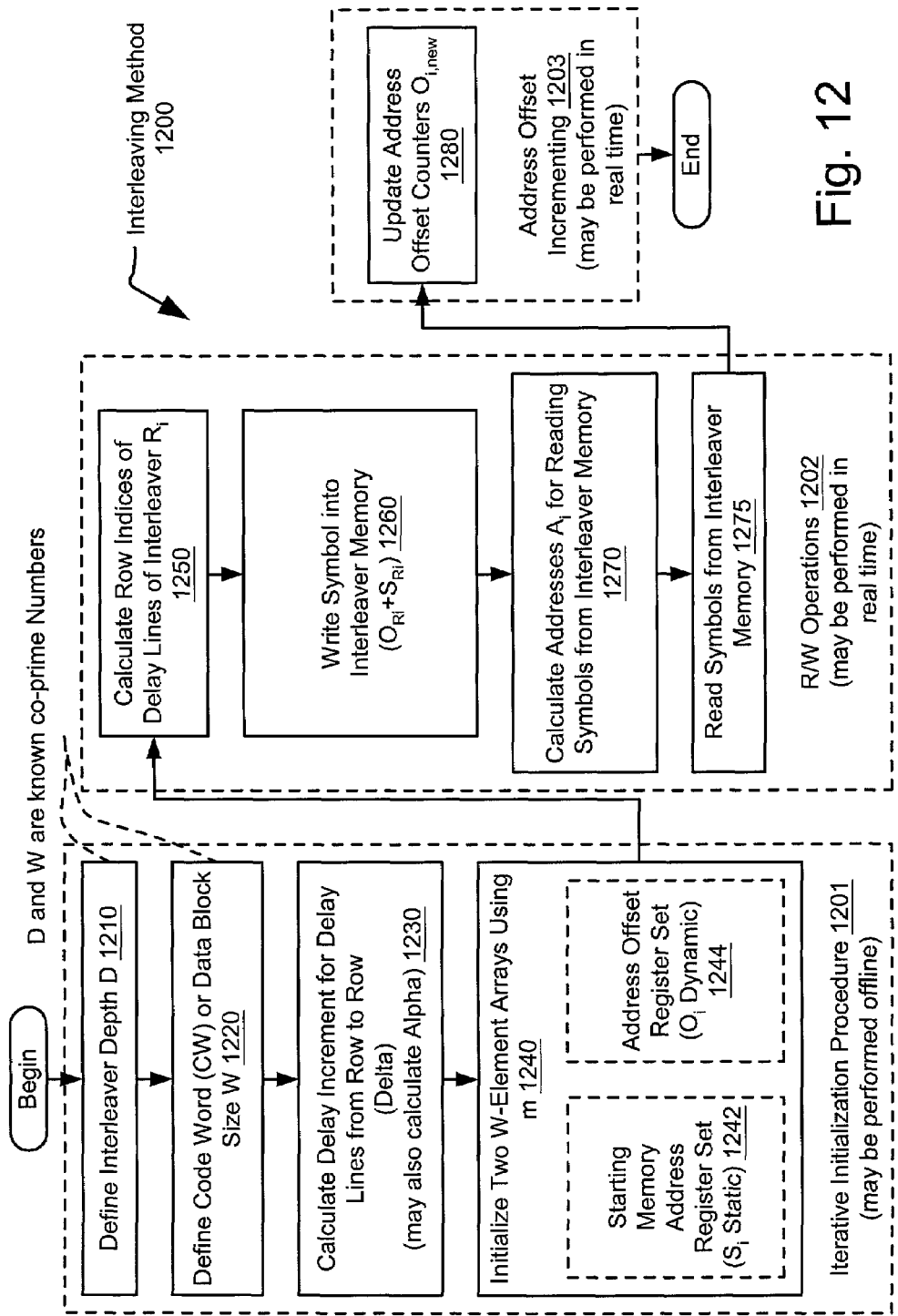
FIG. 12 is a functional block diagram illustrating another embodiment of an interleaving method that is performed in accordance with certain aspects of the present invention.
Figure 13:
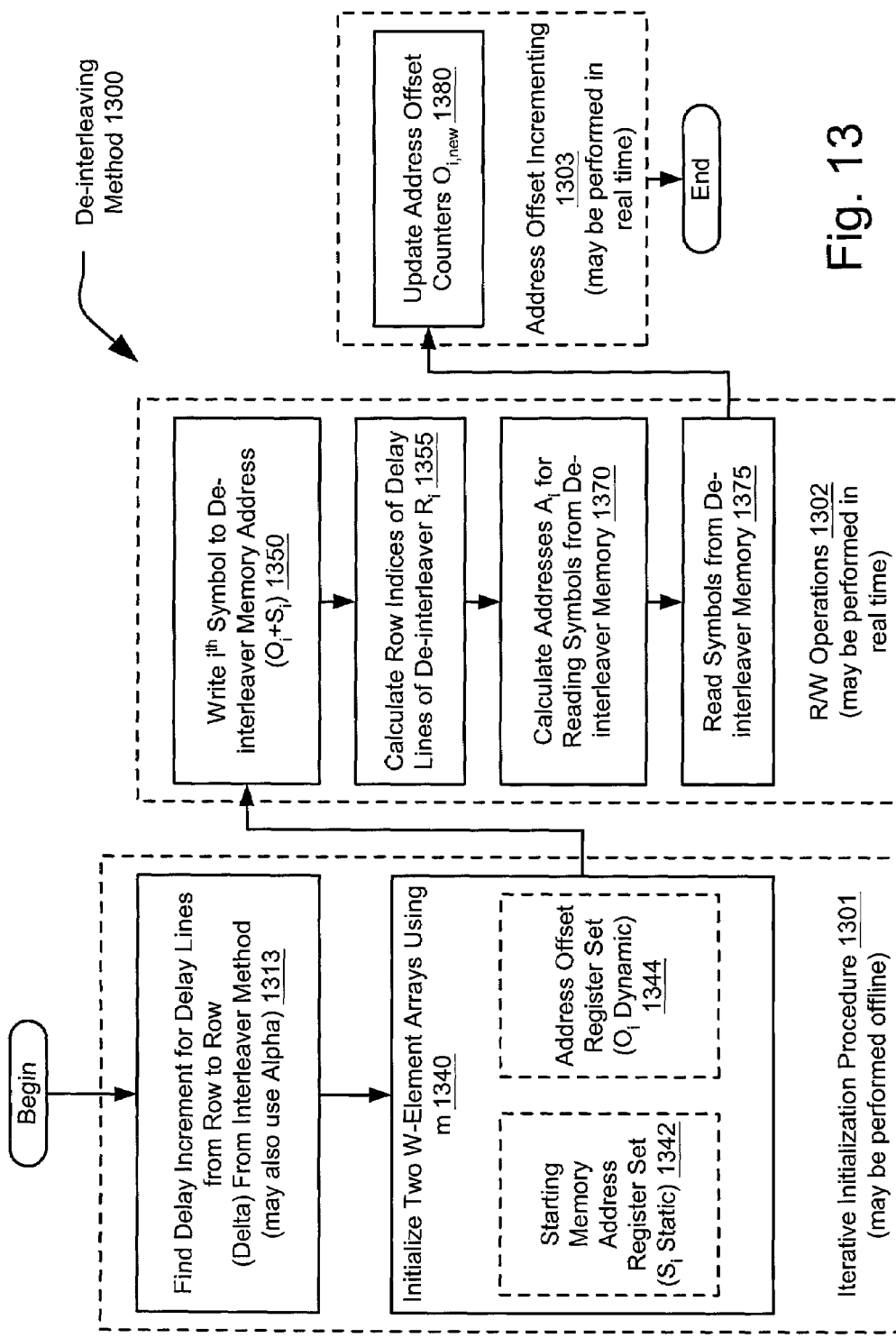
FIG. 13 is a functional block diagram illustrating another embodiment of a de-interleaving method that is performed in accordance with certain aspects of the present invention.

FIG. 12 is a functional block diagram illustrating another embodiment of an interleaving method 1200 that is performed in accordance with certain aspects of the present invention. The following iterative initialization procedure 1201 may be performed offline, in an effort to preserve and save processing and computational resources for systems employing the interleaving method 1200.

To begin, the interleaving depth D must be defined, as shown in a block 1210 and a code word (or data block) size W must be defined, as shown in a block 1220. The FIG. 12 also describes how the interleaving method 1200 may be performed including the updating of the read and write (R/W) address pointers.

a) One of the first steps, as shown in a block 1230, is to find the delay increment parameter from row to row. This parameter can be solved by equation (1), which is rewritten as following:

$$\alpha \times D - \Delta \times W = 1$$

As in previous section, D is interleaver depth, W is the code word size (or block size), and $\alpha$ and $\Delta$ are two minimum positive integers satisfying this equation. Additionally, D and W need to be co-prime numbers. From certain perspectives, the values of D (interleaver depth) and W (code word size or block size) are linearly combined, each having a respective coefficient, thereby summing to a constant value.

Both $\alpha$ and $\Delta$ may be calculated, as shown in the block 1230, yet only the value $\Delta$ is required, as $\Delta$ may be represented in terms of $\alpha$. Once $\Delta$ is found, the next step is to initialize the two W-element arrays as shown in a block 1240: S, starting addresses for each delay line in the memory (that may be RAM) as shown in a block 1242; and O, address offset counters for each delay line as shown in a block 1244. The following equations show how to accomplish this:

$$m_i = \begin{cases} 0 & \text{for } i = 0 \\ (m_{i-1} + \Delta)\%D & \text{for } i \neq 0 \end{cases} \text{ for } i = 0 \ldots W. \quad (12)$$

$$S_i = \begin{cases} 0 \text{ for } i = 0 \\ S_{i-1} + m_i + 1 \text{ for } i \neq 0 \end{cases} \text{ for } i = 0 \ldots W. \quad (13)$$

$$O_i = S_{i+1} - S_i - 1 \quad i = 0 \ldots W-1 \quad (14)$$

Where % is the modulo operator. Note that the delay for each delay line, or length of the delay line, can be calculated by $S_{i+1}-S_i$.

The following R/W operations 1202 may be performed in real time within the interleaving method 1200. The method can relax the time required to perform R/W from the "symbol based real time" to the "code word based real time."

b) Read and write operations are done, in this embodiment, on a code word by code word basis. Writing symbols to the interleaver memory is not necessarily in a row-by-row sequential order of the delay lines. In fact it jumps from row to row based on the interleave depth. To do this, the row indices of the interleaver are calculated as being $R_i$, as shown in a block 1250. Let $R_i$ be the row index of the delay line to be written to, it is determined by the following equation:

$$R_i = \begin{cases} 0 & i = 0 \\ (R_{i-1} + D)\%W & i \neq 0, \text{ for } i = 1 \ldots W-1. \end{cases} \quad (15)$$

After calculating $R_i$, the input symbol $c_i$ is written in the interleaver memory at address $O_{R_i}+S_{R_i}$, as shown in a block 1260. Then, the addresses $A_i$ are calculated for reading symbols from interleaver memory as shown in a block 1270 and as shown below in Equation 16. Reading symbols from the interleaver memory is done in a row-by-row sequential order as shown in a block 1275. The addresses can be determined by:

$$A_i = \begin{cases} O_i + S_i + 1 & \text{if } (O_i + S_i + 1) < S_{i+1} \\ S_i & \text{Otherwise} \end{cases} \text{ for } i = 0 \ldots W-1. \quad (16)$$

It is also noted that for the same row, the read address is usually greater than the write address by one. The address offsets are modular numbers of $S_{i+1}-S_i$.

The following address offset incrementing 1203 may be performed as close as possible to real time within the interleaving method 1200. This real time incrementing (or updating) within the functional block 1203 may also be viewed as actually being "quasi-real time," as it may be performed on a code word by code word basis.

c) After writing to and reading from the interleaver a complete code word (or a block of data of length W), the address offset counters for each delay line need to be updated as shown in a block 1280 and as shown as follows:

$$O_{i,new} = \begin{cases} O_{i,old} + 1 & \text{if } S_i + O_{i,old} + 1 < S_{i+1} \\ 0 & \text{if } O_{i,old} + S_i + 1 \geq S_{i+1} \end{cases} \text{ for } i = 0 \ldots W-1. \quad (17)$$

FIG. 13 is a functional block diagram illustrating another embodiment of a de-interleaving method 1300 that is performed in accordance with certain aspects of the present invention. From certain perspectives, the de-interleaver method 1300 operates in the reverse operation of that of the interleaver method 1200 described in the FIG. 12. The de-interleaver method 1300 can be described as shown below.

The following iterative initialization procedure 1301 may be performed offline, in an effort to preserve and save processing and computational resources for systems employing the de-interleaving method 1300.

a) The first step is the same as in interleaver to find the delay increment parameter $\Delta$ as shown in a block 1313 (and $\alpha$ as well, if desired) by solving equation (1). Once $\Delta$ is found, the next step, as shown in a block 1340, is to initialize the two W-element arrays: S, starting addresses for each delay line in the memory (that may be RAM) as shown in a block 1342; and O, address offset counters for each delay line as shown in a block 1344. The following equations show how to accomplish this:

$$m_i = \begin{cases} 0 \text{ for } i = 0 \\ (m_{i-1} + \Delta)\%D \text{ for } i \neq 0 \end{cases} \text{ for } i = 0 \ldots W. \quad (18)$$

$$S_i = \begin{cases} 0 \text{ for } i = 0 \\ S_{i-1} + m_i + 1 \text{ for } i \neq 0 \end{cases} \text{ for } i = 0 \ldots W. \quad (19)$$

$$O_i = S_{i+1} - S_i - 1$$

Here, % is the modulo operator. It is also noted that the delay for each delay line, or length of the delay line, may be calculated by $S_{i+1}-S_i$.

The following R/W operations 1302 may be performed in real time within the de-interleaving method 1300.

b) Read and Write operations are done code word by code word in this embodiment. Writing symbols to the interleaver memory is in a row-by-row sequential order of the delay line as opposite to that of interleaver. The $i^{th}$ symbol is written to address $O_i+S_i$ as shown in a block 1350 Read operation is not in a row-by-row sequential order. In fact it jump from row to row by interleave depth. To do this, the row indices of the de-interleaver are calculated as being $R_i$, as shown in a block 1355 and as described below in the Equation 20. Let $R_i$ be the row index of the delay line of the de-interleaver, it is determined by the following equation:

$$R_i = \begin{cases} 0 & i = 0 \\ (R_{i-1} + D)\%W & i \neq 0, \text{ for } i = 1 \ldots W-1. \end{cases} \quad (20)$$

Then, the addresses $A_i$ are calculated for reading symbols from de-interleaver memory as shown in a block 1370 and as shown below in Equation 21. After calculating $R_i$, the out symbol is read from the de-interleaver memory at address, as shown in a block 1375, and as determined by the following equation:

$$A_i = \begin{cases} O_{R_i} + S_{R_i} + 1 & \text{if } (O_{R_i} + S_{R_i} + 1) < S_{R_i+1} \\ S_{R_i} & \text{Otherwise} \end{cases} \text{ for } i = 0 \ldots W-1. \quad (21)$$

The following address offset incrementing 1303 may be performed in real time within the de-interleaving method 1300. In addition, the real time incrementing (or updating) within the functional block 1303 may be viewed as being quasi-real time, as it may be performed on a code word by code word basis (stated another way, a block by block basis) and not on a R/W cycle basis per se.

c) After reading from and writing to the de-interleaver a complete code word (or block), the address offset counters of the delay line needs to be updated as following:

$$O_{i,new} = \begin{cases} O_{i,old} + 1 & \text{if } S_i + O_{i,old} + 1 < S_{i+1} \\ 0 & \text{if } O_{i,old} + S_i + 1 \geq S_{i+1} \end{cases} \text{ for } i = 0 \ldots W-1. \quad (22)$$

In view of the above detailed description of the invention and associated drawings, other modifications and variations will now become apparent to those skilled in the art. It should also be apparent that such other modifications and variations may be effected without departing from the spirit and scope of the invention.

APPENDIX

For convolutional interleaver and convolutional de-interleaver designs (including RAM-based implementations), the delay increment parameter $\Delta$ (and also $\alpha$, when both $\alpha$ and $\Delta$ are desired in certain applications) that satisfy equation (1) may is rewritten below:

$$\alpha \times D - \Delta \times W = 1$$

Here, $\alpha$ and $\Delta$ are two unknown minimum positive integer numbers. D and W are co-prime numbers. Under these conditions, $\alpha$ and $\Delta$ may be uniquely determined.

Proof: Assume there are two pairs of positive integer numbers, $(\alpha_1, D_1)$ and $(\alpha_2, D_2)$, both satisfying the equation above. Then $$\alpha_1 \times D - \Delta_1 \times W = 1 \quad (23)$$

$$\alpha_2 \times D - \Delta_2 \times W = 1 \quad (24)$$

Subtracts (24) from (23), we have $$(\alpha_1 - \alpha_2) \times D - (\Delta_1 - \Delta_2) \times W = 0 \quad (25)$$

Without losing generality, assume $\alpha_1$ is greater than $\alpha_2$, and then $\Delta_1$ must be less than $\Delta_2$. Otherwise, $\alpha_1$ and $\Delta_1$ are not a minimum integer pair satisfying equation (1). However, if $\alpha_1$ is greater than $\alpha_2$ and $\Delta_1$ is less than $\Delta_2$, then there is no solution for equation 25. So $\alpha_1$ must be equal to $\alpha_2$. Then $\Delta_1$ is equal to $\Delta_2$. Therefore, the solution is unique.

What is claimed is:

1. A communication system that performs interleaving and de-interleaving, comprising:
   an interleaver that is operable to interleave data, thereby generating interleaved data;
   a de-interleaver that is operable to de-interleave the interleaved data, thereby generating output data that is a substantial replica of the data;
   the interleaver delays a portion of the data by a first delay in performing the interleaving;
   the de-interleaver delays the portion of the interleaved data by a second delay in performing the de-interleaving; and
   wherein each portion of data that undergoes interleaving and de-interleaving incurs a substantially constant delay comprising the first delay and the second delay;
   at least one of the interleaver and the de-interleaver comprises a starting address register set, an offset address register set comprising a plurality of values that is operable to be updated, and a memory.

2. The communication system of claim 1, wherein the interleaving performed by the interleaver comprises convolutional interleaving.

3. The communication system of claim 1, wherein the de-interleaving performed by the de-interleaver comprises convolutional de-interleaving.

4. The communication system of claim 1, wherein the memory comprises random access memory.

5. The communication system of claim 1, wherein a delay line increment for both the interleaver and the de-interleaver is calculated based on an interleaver depth value and a code word size value;
   the interleaver depth value, having a first coefficient, and the code word size value, having a second coefficient, are linearly combined thereby summing to a constant value of one; and
   the delay line increment comprises at least one of the first coefficient and the second coefficient.

6. The communication system of claim 1, wherein at least one of the interleaver and the de-interleaver performs read/write operations into and out of the memory on a code word by code word basis.

7. The communication system of claim 1, wherein the starting address register set and the offset address register set are initialized offline.

8. The communication system of claim 1, wherein the starting address register set comprises a static register set and the offset address register set comprises a dynamic register set that is operable to be updated.

9. The communication system of claim 1, wherein the offset address register set is updated on a code word by code word basis.

10. The communication system of claim 1, wherein at least one of the interleaver and the de-interleaver further comprises a processing circuitry.

11. The communication system of claim 10, wherein at least one of the data and the interleaved data comprises a symbol, the symbol is written to and read from a location in the memory;
    the memory comprises a plurality of delay lines;
    the processing circuitry is operable to calculate a row index corresponding to a delay line within the plurality of delay lines; and
    the row index is used to select the location to which the symbol is written to and read from in the memory.

12. The communication system of claim 11, wherein the data comprises at least one additional symbol; and
    at least one of the interleaver and the de-interleaver further comprises an output buffer that is operable to re-order the symbol and at least one additional symbol before outputting the symbol and the at least one additional symbol.

13. The communication system of claim 11, wherein the plurality of delay lines are arranged in an order that is sequentially non-increasing and sequentially non-decreasing.

14. The communication system of claim 1, wherein the interleaving comprises RAM-based interleaving.

15. The communication system of claim 1, wherein the de-interleaving comprises RAM-based de-interleaving.

16. A communication system, comprising:
    an encoder that encodes a source signal to generate an encoded signal;

an interleaver that interleaves the encoded signal, thereby generating an encoded, interleaved signal;

a modulator that modulates the encoded, interleaved signal to generate an encoded, interleaved, modulated signal;

a communication channel that receives and communicates the encoded, interleaved, modulated signal;

a demodulator that demodulates the encoded, interleaved, modulated signal to generate a encoded, interleaved, demodulated signal;

a de-interleaver that de-interleaves the encoded, interleaved, demodulated signal, thereby generating a encoded, de-interleaved, demodulated signal; and a decoder that decodes the encoded, de-interleaved, demodulated signal to generate an output signal that is a substantial replica of the source signal; and wherein the interleaver comprises an interleaver starting address register set, an interleaver offset address register set, and an interleaver memory;

the de-interleaver comprises a de-interleaver starting address register set, a de-interleaver offset address register set and a de-interleaver memory; and at least one of the interleaver offset address register set and the de-interleaver offset address register set comprises a plurality of values that is operable to be updated.

17. The communication system of claim 16, wherein the interleaver delays a portion of the encoded signal by a first delay, selected from a plurality of first delays, in performing the interleaving;

the de-interleaver delays a portion of the encoded, interleaved, demodulated signal by a second delay, selected from a plurality of second delays, in performing the de-interleaving;

each first delay within the plurality of first delays corresponds to one second delay within the plurality of second delays to form a plurality of delay combinations;

each delay combination within the plurality of delay combinations comprises a substantially constant delay.

18. The communication system of claim 16, wherein the interleaving performed by the interleaver comprises convolutional interleaving.

19. The communication system of claim 16, wherein the de-interleaving performed by the de-interleaver comprises convolutional de-interleaving.

20. The communication system of claim 16, wherein a delay line increment for both the interleaver and the de-interleaver is calculated based on an interleaver depth value and a code word size value;

the interleaver depth value, having a first coefficient, and the code word size value, having a second coefficient, are linearly combined thereby summing to a constant value of one; and the delay line increment comprises at least one of the first coefficient and the second coefficient.

21. The communication system of claim 16, wherein the interleaver and the de-interleaver performs read/write operations into the interleaver memory on a code word by code word basis.

22. The communication system of claim 16, wherein the de-interleaver performs read/write operations into and out of the de-interleaver memory on a code word by code word basis.

23. The communication system of claim 16, wherein the interleaver starting address register set and the interleaver offset address register set are initialized offline.

24. The communication system of claim 16, wherein the de-interleaver staffing address register set and the de-interleaver offset address register set are initialized offline.

25. The communication system of claim 16, wherein at least one of the interleaver starting address register set and the de-interleaver starting address register set comprises a static register set and at least one of the interleaver offset address register set and the de-interleaver offset address register set comprises a dynamic register set that is operable to be updated.

26. The communication system of claim 16, wherein at least one of the interleaver offset address register set and the de-interleaver offset address register set is updated on a code word by code word basis.

27. The communication system of claim 16, wherein at least one of the interleaver and the de-interleaver further comprises a processing circuitry.

28. The communication system of claim 16, wherein at least one of the interleaver memory and the de-interleaver memory comprises random access memory.

29. The communication system of claim 16, wherein at least one of the interleaver memory and the de-interleaver memory comprises a plurality of delay lines.

30. The communication system of claim 29, wherein the plurality of delay lines are arranged in an order that is sequentially non-increasing and sequentially non-decreasing.

31. The communication system of claim 16, wherein the interleaving performed by the interleaver comprises RAM-based interleaving.

32. The communication system of claim 16, wherein the de-interleaving performed by the de-interleaver comprises RAM-based de-interleaving.

33. An interleaver that interleaves a plurality of symbols, the interleaver comprising:

a memory that stores a plurality of delay lines;

a starting memory address register set that stores a plurality of starting addresses that corresponds to the plurality of delay lines within the memory;

an address offset register set that stores a plurality of addresses offsets that corresponds to the plurality of delay lines within the memory;

a processing circuit that calculates a plurality of row indices; and wherein a row index within the plurality of row indices is used to identify a location in the memory that corresponds to a delay line within the plurality of delay lines by identifying a starting address within the plurality of starting addresses and an address offsets within the plurality of addresses offsets; and the identified delay line is used to delay a symbol within the plurality of symbols during the interleaving.

34. The interleaver of claim 33, wherein the interleaving performed by the interleaver comprises convolutional interleaving.

35. The interleaver of claim 33, wherein at least one of the starting memory address register set and the address offset register set is initialized offline.

36. The interleaver of claim 33, wherein the starting address register set comprises a static register set and the offset address register set comprises a dynamic register set that is operable to be updated.

37. The interleaver of claim 36, wherein the offset address register set is updated on a code word by code word basis.

38. The interleaver of claim 33, wherein the processing circuit calculates the plurality of row indices in real time.

39. The interleaver of claim 33, further comprising a buffer that is operable to reorder the plurality of symbols.

40. The interleaver of claim 33, further comprising a de-interleaver that de-interleaves the plurality of symbols.

41. The interleaver of claim 40, wherein each symbol within the plurality of symbols incurs a substantially constant delay during its interleaving an de-interleaving 42. The interleaver of claim 33, wherein a delay line increment for the interleaver is calculated based on an interleaver depth value and a block size value;
the interleaver depth value, having a first coefficient, and the block size value, having a second coefficient, are linearly combined thereby summing to a constant value; and
the delay line increment comprises at least one of the first coefficient and the second coefficient.

43. The interleaver of claim 33, wherein the interleaver performs read/write operations into the memory on a code word by code word basis.

44. A de-interleaver that de-interleaves a plurality of symbols, the de-interleaver comprising:
a memory that stores a plurality of delay lines;
a starting memory address register set that stores a plurality of starting addresses that corresponds to the plurality of delay lines within the memory;
an address offset register set that stores a plurality of addresses offsets that corresponds to the plurality of delay lines within the memory;
a processing circuit that calculates a plurality of row indices; and
wherein a row index within the plurality of row indices is used to identify a location in the memory that corresponds to a delay line within the plurality of delay lines by identifying a starting address within the plurality of starting addresses and an address offsets within the plurality of addresses offsets; and
the identified delay line is used to delay a symbol within the plurality of symbols during the interleaving.

45. The de-interleaver of claim 44, wherein the de-interleaving performed by the de-interleaver comprises convolutional de-interleaving.

46. The de-interleaver of claim 44, wherein at least one of the starting memory address register set and the address offset register set is initialized offline.

47. The de-interleaver of claim 44, wherein the starting address register set comprises a static register set and the offset address register set comprises a dynamic register set that is operable to be updated.

48. The de-interleaver of claim 47, wherein the offset address register set is updated on a code word by code word basis.

49. The de-interleaver of claim 44, wherein the processing circuit calculates the plurality of row indices in real time.

50. The de-interleaver of claim 44, further comprising a buffer that is operable to reorder the plurality of symbols.

51. The de-interleaver of claim 44, further comprising a interleaver that interleaves the plurality of symbols before the de-interleaver de-interleaves the plurality of symbols.

52. The de-interleaver of claim 51, wherein each symbol within the plurality of symbols incurs a substantially constant delay during its interleaving an de-interleaving.

53. The de-interleaver of claim 44, wherein a delay line increment for the de-interleaver is calculated based on an interleaver depth value and a block size value;
the interleaver depth value, having a first coefficient, and the block size value, having a second coefficient, are linearly combined thereby summing to a constant value of one; and
the delay line increment comprises at least one of the first coefficient and the second coefficient.

54. The de-interleaver of claim 44, wherein the de-interleaver performs read/write operations into the memory on a code word by code word basis.

55. A method to perform interleaving of a plurality of symbols, the method comprising:
calculating a delay line increment based on an interleaver depth value and a block size value;
using the delay line increment to define a plurality of delay lines that are stored in a memory;
initializing a plurality of starting memory addresses that corresponds to the plurality of delay lines in the memory;
initializing a plurality of address offsets that corresponds to the plurality of delay lines in the memory;
calculating a plurality of row indices;
identifying a starting address within the plurality of starting addresses and an address offsets within the plurality of addresses offsets by using a row index within the plurality of row indices;
identifying a location in the memory that corresponds to the identified starting address and the identified address offset;
performing at least one of reading a symbol from the first location in the memory and writing the symbol into the location; and
wherein the at least one of the reading and the writing of the symbol into the location in the memory incurs a delay to the symbol during the interleaving;
an interleaver depth value, having a first coefficient, and the block size value, having a second coefficient, are linearly combined thereby summing to a constant value; and
the delay line increment comprises at least one of the first coefficient and the second coefficient.

56. The method of claim 55, wherein interleaving comprises convolutional interleaving.

57. The method of claim 55, wherein at least one of the starting memory address register set and the address offset register set is initialized offline.

58. The method of claim 55, wherein the starting address register set comprises a static register set and the offset address register set comprises a dynamic register set that is operable to be updated.

59. The method of claim 58, further comprising updating the offset address register set on a code word by code word basis.

60. The method of claim 55, further comprising calculating the plurality of row indices in real time.

61. The method of claim 55, further comprising reordering the plurality of symbols.

62. The method of claim 55, further comprising de-interleaving the plurality of symbols.

63. The method of claim 62, wherein each symbol within the plurality of symbols incurs a substantially constant delay during its interleaving an de-interleaving.

64. The method of claim 55, wherein at least one of the reading and the writing of the symbol into the location is performed on a code word by code word basis.

65. A method to perform de-interleaving of a plurality of symbols, the method comprising:

calculating a delay line increment based on an interleaver depth value and a block size value;

using the delay line increment to define a plurality of delay lines that are stored in a memory;

initializing a plurality of starting memory addresses that corresponds to the plurality of delay lines in the memory;

initializing a plurality of address offsets that corresponds to the plurality of delay lines in the memory;

calculating a plurality of row indices;

identifying a starting address within the plurality of starting addresses and an address offsets within the plurality of addresses offsets by using a row index within the plurality of row indices;

identifying a location in the memory that corresponds to the identified starting address and the identified address offset;

performing at least one of reading a symbol from the first location in the memory and writing the symbol into the location; and wherein the at least one of the reading and the writing of the symbol into the location in the memory incurs a delay to the symbol during the de-interleaving;

an interleaver depth value, having a first coefficient, and the block size value, having a second coefficient, are linearly combined thereby summing to a constant value; and the delay line increment comprises at least one of the first coefficient and the second coefficient.

66. The method of claim 65, wherein interleaving comprises at least one of convolutional de-interleaving and block de-interleaving.

67. The method of claim 65, wherein at least one of the starting memory address register set and the address offset register set is initialized offline.

68. The method of claim 65, wherein the starting address register set comprises a static register set and the offset address register set comprises a dynamic register set that is operable to be updated.

69. The method of claim 68, further comprising updating the offset address register set on a code word by code word basis.

70. The method of claim 65, further comprising calculating the plurality of row indices in real time.

71. The method of claim 65, further comprising reordering the plurality of symbols.

72. The method of claim 65, further comprising interleaving the plurality of symbols before performing the de-interleaving.

73. The method of claim 72, wherein each symbol within the plurality of symbols incurs a substantially constant delay during its interleaving an de-interleaving.

* * * * *

UNITED STATES PATENT AND TRADEMARK OFFICE
CERTIFICATE OF CORRECTION

PATENT NO. : 7,024,596 B2
APPLICATION NO. : 10/012834
DATED : April 4, 2006
INVENTOR(S) : Weizhuang Xin It is certified that error appears in the above-identified patent and that said Letters Patent is hereby corrected as shown below:

The written description portions beginning at Column 10, line 8 and continuing to the words "503, to a" in Column 10, line 44 should be removed there from and properly be placed, after beginning a new paragraph, before the words "delay D 504, 504, to a delay E" in Column 8, line 33.

--In this embodiment, the switch 420 is operable to switch into any of the various delay lines 450, that have lengths varying from a delay A 401, to a delay B 402, to a delay C 403, to a delay D 404, to a delay E 405, to a delay F 406, …, and to a delay G 409. The lengths of the delay lines 450 need not be in increasing or decreasing order.

The writing of data is performed on the left hand side of the convolutional interleaver 400, from the switch 420. Any various delay line length may be used for a particular portion of data. Analogously, a switch 430 is operable to read out data that has been written with any of the various delay line lengths, as shown in the functional blocks 401-409. The switch 430 switches in the interleaved data and provides it to a modulator in accordance with the present invention. The lengths of the delay lines that are used for both the interleaving and de-interleaving processes follow certain rules that operate together to ensure that the data is properly interleaved and de-interleaved.

FIG. 5 is a system diagram illustrating another embodiment of a convolutional de-interleaver that is built in accordance with certain aspects of the present invention. From certain perspectives, the convolutional de-interleaver 500 operates in the inverse of the convolutional interleaver 400 described above and in the FIG. 4. The convolutional de-interleaver 500 receives data from a demodulator at a switch 520. The switch 520 is operable to switch that data to any number of delay line lengths, shown by the delay lines 550 in the convolutional de-interleaver 500. As mentioned above in other embodiments, the length of the delay lines are not necessarily in increasing order as the row number is increased. The embodiment shown in the FIG. 5 shows delay lines 550, of various and different lengths, that are not in increasing or decreasing order.

In this embodiment, the switch 520 is operable to switch into any of the various delay lines 550, that have lengths varying from a delay A 501, to a delay B 502, to a delay C 503, to a--

UNITED STATES PATENT AND TRADEMARK OFFICE
CERTIFICATE OF CORRECTION

PATENT NO. : 7,024,596 B2
APPLICATION NO. : 10/012834
DATED : April 4, 2006
INVENTOR(S) : Weizhuang Xin It is certified that error appears in the above-identified patent and that said Letters Patent is hereby corrected as shown below:

Column 18, line 20, 2nd line of Equation (18): replace "for i=0 … W" with --for i=1 … W--

Column 18, line 25, 2nd line of Equation (19): replace "S_(i-1) + m_i + 1" with --S_(i-1) + D - m_i--

Column 18, line 25, 2nd line of Equation (19): replace "for i=0 … W" with --for i=1 … W--

Column 23, lines 7, in Claim 41: replace "an" with --and--

Column 23, lines 64, in Claim 52: replace "an" with --and--

Column 24, lines 63, in Claim 63: replace "an" with --and--

Column 26, lines 25, in Claim 73: replace "an" with --and--

Signed and Sealed this

Twenty-fourth Day of June, 2008

JON W. DUDAS
*Director of the United States Patent and Trademark Office*